United States Patent
Tamaso

(10) Patent No.: US 8,395,163 B2
(45) Date of Patent: Mar. 12, 2013

(54) SEMICONDUCTOR DEVICE

(75) Inventor: Hideto Tamaso, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 340 days.

(21) Appl. No.: 12/937,435

(22) PCT Filed: Apr. 13, 2009

(86) PCT No.: PCT/JP2009/057435
§ 371 (c)(1),
(2), (4) Date: Oct. 12, 2010

(87) PCT Pub. No.: WO2009/128419
PCT Pub. Date: Oct. 22, 2009

(65) Prior Publication Data
US 2011/0031506 A1    Feb. 10, 2011

(30) Foreign Application Priority Data

Apr. 15, 2008  (JP) ................................ 2008-105739

(51) Int. Cl.
*H01L 29/15*    (2006.01)
*H01L 27/15*    (2006.01)

(52) U.S. Cl. ............ 257/77; 257/79; 257/288; 257/901; 257/E29.297; 257/E29.298

(58) Field of Classification Search .................... 257/77, 257/288, 901, E29.297, E29.298, 79
See application file for complete search history.

(56) References Cited

U.S. PATENT DOCUMENTS

| | | | |
|---|---|---|---|
| 4,990,994 A | 2/1991 | Furukawa et al. | |
| 5,124,779 A | 6/1992 | Furukawa et al. | |
| 5,920,794 A | 7/1999 | Hong | |
| 2004/0183080 A1 | 9/2004 | Kusumoto et al. | |
| 2006/0267022 A1 | 11/2006 | Mizukami et al. | |
| 2008/0203400 A1* | 8/2008 | Fukuda et al. | 257/77 |
| 2009/0160008 A1* | 6/2009 | Fujiwara et al. | 257/471 |
| 2010/0102332 A1 | 4/2010 | Takahashi et al. | |

FOREIGN PATENT DOCUMENTS

| | | |
|---|---|---|
| CN | 1172551 A | 2/1998 |
| CN | 1532943 A | 9/2004 |
| JP | 62071271 A | 4/1987 |

(Continued)

OTHER PUBLICATIONS

Tsukimoto et al., "Simultaneous Formation of p- and n-Type Ohmic Contacts to 4H-SiC Using the Ternary Ni/Ti/Al System," Journal of Electronic Materials, vol. 34, No. 10, pp. 1310-1312 (2005).

(Continued)

*Primary Examiner* — Long Tran
(74) *Attorney, Agent, or Firm* — Venable LLP; Michael S. Sartori

(57) ABSTRACT

A MOSFET capable of achieving decrease in the number of steps in a manufacturing process and improvement in integration includes an SiC wafer composed of silicon carbide and a source contact electrode arranged in contact with the SiC wafer and containing titanium, aluminum, silicon, and carbon as well as a remaining inevitable impurity. The SiC wafer includes an $n^+$ source region having an n conductivity type and a $p^+$ region having a p conductivity type. Both of the $n^+$ source region and the $p^+$ region are in contact with the source contact electrode. The source contact electrode contains aluminum and titanium in a region including an interface with the SiC wafer.

13 Claims, 11 Drawing Sheets

FOREIGN PATENT DOCUMENTS

| | | |
|---|---|---|
| JP | 3111566 A | 5/1991 |
| JP | 3133176 A | 6/1991 |
| JP | 2002075909 A | 3/2002 |
| JP | 2004304174 A | 10/2004 |
| JP | 2005033030 A | 2/2005 |
| JP | 2007013087 A | 1/2007 |
| JP | 2008227174 A | 9/2008 |
| WO | WO-9622611 A1 | 7/1996 |

OTHER PUBLICATIONS

Tanimoto et al., "Practical Device-Directed Ohmic Contacts on 4H-SiC," IEICE Transactions C, the Institute of Electronics, Information and Communication Engineers, vol. J86-C, No. 4, pp. 359-367, Apr. 2003.

Hideto Tamaso, U.S. Appl. No. 12/937,450, "Semiconductor Device and Method of Manufacturing the Same", filed Oct. 12, 2010.

Mohammed et al., "Si-Induced Enhancement of Ohmic Performance of Ti/Al/Mo/Au Metallisation for AlGaN/GaN HEMTs," Electronics Letters, vol. 41, No. 17 (Aug. 18, 2005).

Hui et al., "Ti-Al Based Ohmic Contacts to n-type 6H-SiC with P Ion Implantation," Chinese Physics, vol. 15, No. 9, pp. 2142-2145 (Sep. 1, 2006).

Uemoto, T., "Reduction of Ohmic Contact Resistance on n-Type 6H-SiC by Heavy Doping," Japanese Journal of Applied Physics, vol. 34, No. 1A, Part 2, pp. L7-L9 (Jan. 1, 1995).

Wenzel et al., "Diffusion Barriers on Titanium-Based Ohmic Contact Structures on SiC," 1998 High-Temperature Electronic Materials, Devices and Sensors Conference, IEEE New York, NY, pp. 159-164 (1998).

Chang et al., "Investigation of Au/Ti/Al Ohmic Contact to n-Type 4H-SiC," Solid-State Electronics, vol. 49, No. 12, pp. 1937-1941 (Dec. 1, 2005).

Ryu et al., "10-kV, 123-m$\Omega \cdot cm^2$ 4H-SiC Power DMOSFETs," IEEE Electron Device Letters, vol. 25, No. 8, pp. 556-558 (Aug. 1, 2004).

* cited by examiner

SEMICONDUCTOR DEVICE

TECHNICAL FIELD

The present invention relates to a semiconductor device and a method of manufacturing the same, and more particularly to a semiconductor device including an electrode arranged in contact with an SiC wafer composed of silicon carbide.

BACKGROUND ART

In a semiconductor device, in many cases, a structure in which an n-type region having an n conductivity type and a p-type region having a p conductivity type are formed and an electrode is connected to the n-type region and the p-type region is adopted. With higher efficiency being achieved in recent years in an apparatus where a semiconductor device is included, a semiconductor device is also required to achieve higher efficiency. In order to achieve higher efficiency of a semiconductor device, the electrode above should be low not only in its own resistance (electrical resistance) but also in contact resistance with the n-type region and the p-type region above.

Meanwhile, in order to achieve a higher withstand voltage and lower loss of a semiconductor device and to enable use thereof in an environment at a high temperature, silicon carbide (SiC) has recently been adopted as a material for forming a semiconductor device. SiC is a wide-bandgap semiconductor greater in bandgap than silicon (Si) that has conventionally widely been used as a material for forming a semiconductor device. Therefore, by adopting SiC as a material for forming a semiconductor device, a higher withstand voltage, a lower ON resistance and the like of a semiconductor device can be achieved. In addition, a semiconductor device adopting SiC as a material is also advantageous in that lowering in characteristics when used in an environment at a high temperature is less likely than in a semiconductor device adopting Si as a material.

In adopting SiC as a material for a semiconductor device, however, it is difficult to avoid increase in Schottky barrier between a p-type region, an n-type region and an electrode as compared with an example where Si is adopted as a material for a semiconductor device. Consequently, a problem of difficulty in suppression of increase in contact resistance between a p-type region, an n-type region and an electrode has arisen.

In contrast, it has been known that contact resistance can be lowered by adopting Ni (nickel) as a material for an electrode in contact with an n-type SiC region containing an n-type impurity (an impurity having an n conductivity type) and adopting Ti (titanium)/Al (aluminum) or AlSi alloy as a material for an electrode in contact with a p-type SiC region containing a p-type impurity (an impurity having a p conductivity type) (see, for example, Satoshi TANIMOTO et al., "Practical Device-Directed Ohmic Contacts on 4H-SiC," IEICE Transactions C, the Institute of Electronics, Information and Communication Engineers, April 2003, Vol. J86-C, No. 4, pp. 359-367 (Non-Patent Document 1)).

PRIOR ART DOCUMENTS

Non-Patent Documents

Non-Patent Document 1: Satoshi TANIMOTO et al., "Practical Device-Directed Ohmic Contacts on 4H-SiC," IEICE Transactions C, the Institute of Electronics, Information and Communication Engineers, April 2003, Vol. J86-C, No. 4, pp. 359-367

SUMMARY OF THE INVENTION

Problems to be Solved by the Invention

As described above, by appropriately selecting a material for forming an electrode in accordance with whether a region in contact with an electrode is an n-type SiC region or a p-type SiC region, contact resistance between a p-type region, an n-type region and an electrode can be lowered even when SiC is adopted as a material for a semiconductor device. If a material for forming an electrode in contact with the p-type region is different from a material for forming an electrode in contact with the n-type region, however, a plurality of steps for forming these electrodes are required, which leads to increase in the number of steps in a manufacturing process. Consequently, a problem of increase in manufacturing cost of a semiconductor device arises. In addition, difference between a material for forming an electrode in contact with the p-type region and a material for forming an electrode in contact with the n-type region may prevent improvement in integration of a semiconductor device.

From the foregoing, an object of the present invention is to provide a semiconductor device capable of achieving decrease in the number of steps in a manufacturing process and improvement in integration by including an electrode that can be in contact with any of a p-type SiC region and an n-type SiC region with contact resistance being sufficiently suppressed.

Means for Solving the Problems

A semiconductor device according to one aspect of the present invention includes an SiC wafer composed of silicon carbide and an ohmic contact electrode arranged in contact with the SiC wafer and containing titanium, aluminum, silicon, and carbon as well as a remaining inevitable impurity. The SiC wafer includes an n-type region having an n conductivity type and a p-type region having a p conductivity type. In addition, each of the n-type region and the p-type region is in contact with the ohmic contact electrode above. The ohmic contact electrode contains aluminum and titanium in a region including an interface with the SiC wafer.

An ohmic contact electrode constituting a semiconductor device according to one aspect of the present invention contains aluminum and titanium in a region including an interface with the SiC wafer. Thus, the ohmic contact electrode can be in contact with any of the p-type SiC region and the n-type SiC region with contact resistance being sufficiently suppressed. Consequently, according to the semiconductor device in one aspect of the present invention, an ohmic contact electrode in contact with the p-type region and an ohmic contact electrode in contact with the n-type region can be made of the same material, and a semiconductor device capable of achieving decrease in the number of steps in a manufacturing process and improvement in integration can be provided. Here, a state that "aluminum and titanium are contained in a region including an interface with an SiC wafer" refers to such a state that presence of aluminum and titanium in a region including an interface with an SiC wafer can be detected to an extent clearly distinguishable from noise, for example, by conducting Augèr spectroscopic analysis.

In the semiconductor device in one aspect above, the ohmic contact electrode above may be arranged to extend from a region in contact with the n-type region to a region in contact with the p-type region.

In addition, the semiconductor device in one aspect above may include a plurality of ohmic contact electrodes, one ohmic contact electrode of the plurality of ohmic contact electrodes may be in contact with the n-type region, and another ohmic contact electrode may be in contact with the p-type region.

A semiconductor device according to another aspect of the present invention includes an SiC wafer composed of silicon carbide and an ohmic contact electrode arranged in contact with the SiC wafer and containing titanium, aluminum, silicon, and carbon as well as a remaining inevitable impurity. The SiC wafer includes an n-type region having an n conductivity type and a p-type region having a p conductivity type. In addition, each of the n-type region and the p-type region is in contact with the ohmic contact electrode above. A region of the ohmic contact electrode including a surface opposite to the SiC wafer contains silicon.

An ohmic contact electrode constituting a semiconductor device according to another aspect of the present invention contains silicon in a region including a surface opposite to the SiC wafer. Thus, by containing silicon (Si) in the region including the surface opposite to the SiC wafer, the ohmic contact electrode can be in contact with any of the p-type SiC region and the n-type SiC region with contact resistance being sufficiently suppressed. Consequently, according to the semiconductor device in another aspect of the present invention, an ohmic contact electrode in contact with the p-type region and an ohmic contact electrode in contact with the n-type region can be made of the same material, and a semiconductor device capable of achieving decrease in the number of steps in a manufacturing process and improvement in integration can be provided. Here, a state that "a region including a surface opposite to an SiC wafer contains silicon" refers to such a state that presence of silicon in a region including a surface opposite to an SiC wafer can be detected to an extent clearly distinguishable from noise, for example, by conducting Augèr spectroscopic analysis.

In the semiconductor device in another aspect above, a content of silicon in the ohmic contact electrode may monotonously increase toward the SiC wafer.

In addition, in the semiconductor device in another aspect above, a content of aluminum in the ohmic contact electrode may monotonously decrease toward the SiC wafer.

In addition, in the semiconductor device in another aspect above, a content of titanium in the ohmic contact electrode may monotonously increase from the surface opposite to the SiC wafer toward the SiC wafer and attain to a maximum value, and thereafter may monotonously decrease.

In addition, in the semiconductor device in another aspect above, the ohmic contact electrode may be arranged to extend from a region in contact with the n-type region to a region in contact with the p-type region.

In addition, the semiconductor device in another aspect above may include a plurality of ohmic contact electrodes, one ohmic contact electrode of the plurality of ohmic contact electrodes may be in contact with the n-type region, and another ohmic contact electrode may be in contact with the p-type region.

A semiconductor device according to yet another aspect of the present invention includes an SiC wafer composed of silicon carbide and an ohmic contact electrode arranged in contact with the SiC wafer and containing titanium, aluminum, silicon, and carbon as well as a remaining inevitable impurity. The SiC wafer includes an n-type region having an n conductivity type and a p-type region having a p conductivity type. In addition, each of the n-type region and the p-type region is in contact with the ohmic contact electrode above. In the ohmic contact electrode, a content of aluminum monotonously decreases toward the SiC wafer and a content of silicon monotonously increases toward the SiC wafer.

In the ohmic contact electrode constituting the semiconductor device according to yet another aspect of the present invention, a content of aluminum monotonously decreases toward the SiC wafer and a content of silicon monotonously increases toward the SiC wafer. Thus, the ohmic contact electrode can be in contact with any of the p-type SiC region and the n-type SiC region with contact resistance being sufficiently suppressed. Consequently, according to the semiconductor device in yet another aspect of the present invention, an ohmic contact electrode in contact with the p-type region and an ohmic contact electrode in contact with the n-type region can be made of the same material, and a semiconductor device capable of achieving decrease in the number of steps in a manufacturing process and improvement in integration can be provided.

In the semiconductor device in yet another aspect above, a content of titanium in the ohmic contact electrode may monotonously increase from a surface opposite to the SiC wafer toward the SiC wafer and attain to a maximum value, and thereafter may monotonously decrease.

In addition, in the semiconductor device in yet another aspect above, the ohmic contact electrode may be arranged to extend from a region in contact with the n-type region to a region in contact with the p-type region.

In addition, the semiconductor device in yet another aspect above may include a plurality of ohmic contact electrodes, one ohmic contact electrode of the plurality of ohmic contact electrodes may be in contact with the n-type region, and another ohmic contact electrode may be in contact with the p-type region.

A state that a content of an element monotonously increases or decreases refers to a state that an ohmic contact electrode does not have a region where a content of an element is constant (for example, a continuous region where the content is 0) in a direction of thickness thereof and the content continues to increase or decrease.

Effects of the Invention

As can clearly be understood from the description above, according to the semiconductor device of the present invention, a semiconductor device capable of achieving decrease in the number of steps in a manufacturing process and improvement in integration by including an electrode that can be in contact with any of a p-type SiC region and an n-type SiC region with contact resistance being sufficiently suppressed can be provided.

MODES FOR CARRYING OUT THE INVENTION

Figure 1:
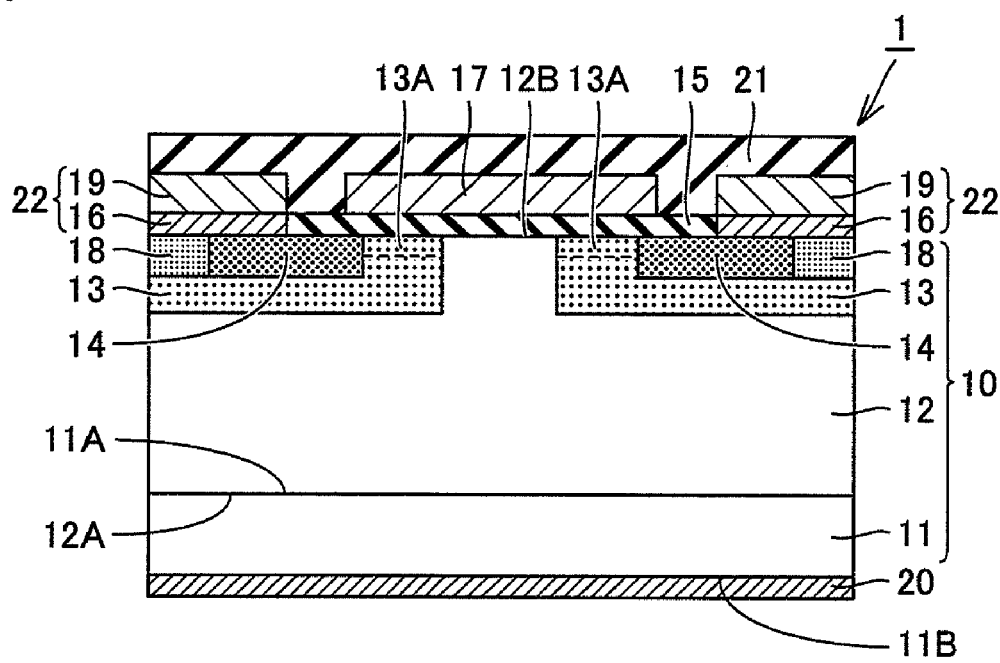
FIG. 1 is a schematic cross-sectional view showing a structure of a MOSFET.

An embodiment of the present invention will be described hereinafter with reference to the drawings. In the drawings below, the same or corresponding elements have the same reference characters allotted and description thereof will not be repeated.

(First Embodiment)

Initially, a MOSFET (Metal Oxide Semiconductor Field Effect Transistor) in the first embodiment will be described. Referring to FIG. 1, a MOSFET 1 in the first embodiment includes an n$^+$ SiC substrate 11 being a substrate composed of silicon carbide (SiC) and having an n conductivity type (a first conductivity type), an n$^-$ SiC layer 12 serving as a semiconductor layer composed of SiC and having the n conductivity type (the first conductivity type), a pair of p bodies 13 serving as second-conductivity-type regions having a p conductivity type (a second conductivity type), an n$^+$ source region 14 serving as a high-concentration first-conductivity-type region having the n conductivity type (the first conductivity type), and a p$^+$ region 18 serving as a high-concentration second-conductivity-type region having the p conductivity type (the second conductivity). N$^-$ SiC layer 12 having p bodies 13, n$^+$ source regions 14 and p$^+$ regions 18 formed therein and n$^+$ SiC substrate 11 constitute an SiC wafer 10 composed of silicon carbide. N$^+$ SiC substrate 11 contains an n-type impurity (an impurity having the n conductivity type) such as N (nitrogen) at high concentration.

N$^-$ SiC layer 12 is formed on one main surface 11A of n$^+$ SiC substrate 11, for example, to a thickness of approximately 10 μm, and it has the n conductivity type by containing an n-type impurity. Examples of n-type impurities contained in n$^-$ SiC layer 12 include N (nitrogen), and an impurity is contained at concentration lower than concentration of an n-type impurity contained in n$^+$ SiC substrate 11, for example, at concentration of $5 \times 10^{15}$ cm$^{-3}$.

A pair of p bodies 13 is formed such that the p bodies are separate from each other so as to include a second main surface 12B which is a main surface opposite to a first main surface 12A which is a main surface on the n$^+$ SiC substrate 11 side, and the pair has the p conductivity type (the second conductivity type) by containing a p-type impurity (an impurity having the p conductivity type). For example, Al, B (boron), or the like is adopted as a p-type impurity to be contained in p body 13, and it is contained at concentration lower than concentration of the n-type impurity contained in n$^+$ SiC substrate 11, for example, at concentration of $1 \times 10^{17}$ cm$^{-3}$.

N$^+$ source region 14 is formed within each p body 13 so as to include second main surface 12B and to be surrounded by p body 13. N$^+$ source region 14 contains an n-type impurity such as P (phosphorus) at concentration higher than concentration of the n-type impurity contained in n$^-$ SiC layer 12, for example, at concentration of $1 \times 10^{20}$ cm$^{-3}$.

P$^+$ region 18 is formed to include second main surface 12B, on the side opposite to n$^+$ source region 14 formed within the other p body 13, when viewed from n$^+$ source region 14 formed within one p body 13 of the pair of p bodies 13. P$^+$ region 18 contains a p-type impurity such as Al or B at concentration higher than concentration of the p-type impurity contained in p body 13, for example, at concentration of $1 \times 10^{20}$ cm$^{-3}$.

Referring further to FIG. 1, MOSFET 1 includes a gate oxide film 15 serving as a gate insulating film, a gate electrode 17, a pair of source contact electrodes 16, a source interconnection 19, a drain electrode 20, and a passivation film 21.

Gate oxide film 15 is formed on second main surface 12B of n$^-$ SiC layer 12 so as to be in contact with second main surface 12B and to extend from an upper surface of one n$^+$ source region 14 to an upper surface of the other n$^+$ source region 14, and it is composed, for example, of silicon dioxide (SiO$_2$).

Gate electrode 17 is arranged in contact with gate oxide film 15 so as to extend from one n$^+$ source region 14 to the other n$^+$ source region 14 over the same. In addition, gate electrode 17 is made of a conductor such as polysilicon, Al or the like.

Source contact electrode 16 is arranged in contact with second main surface 12B, so as to extend from a pair of n$^+$ source regions 14, in a direction away from gate oxide film 15, to p$^+$ region 18. Source contact electrode 16 contains titanium (Ti), aluminum (Al), silicon (Si), and carbon (C) as well as a remaining inevitable impurity. Here, the inevitable impurity includes oxygen (O) inevitably introduced during the manufacturing process. Source contact electrode 16 contains aluminum and titanium in a region including an interface with n$^-$ SiC layer 12 where source region 14 and p$^+$ region 18 are formed.

Source interconnection 19 is formed in contact with source contact electrode 16 and it is made of a conductor such as Al. Source interconnection 19 is electrically connected to n$^+$ source region 14 through source contact electrode 16. This source interconnection 19 and source contact electrode 16 constitute a source electrode 22.

Drain electrode 20 is formed in contact with the other main surface 11B of n$^+$ SiC substrate 11, which is a main surface opposite to one main surface 11A which is a main surface on a side where n$^-$ SiC layer 12 is formed. For example, this drain electrode 20 may be structured similarly to source contact electrode 16 above, or it may be made of another material capable of establishing ohmic contact with $n^+$ SiC substrate 11, such as Ni. Thus, drain electrode 20 is electrically connected to $n^+$ SiC substrate 11.

Passivation film 21 is formed to extend from one source interconnection 19 over gate electrode 17 to the other source interconnection 19. This passivation film 21 is composed, for example, of $SiO_2$ and it has a function to electrically isolate source interconnection 19 and gate electrode 17 from outside and to protect MOSFET 1.

Namely, MOSFET 1 in the present embodiment includes SiC wafer 10 and source contact electrode 16 serving as an ohmic contact electrode, that is arranged in contact with SiC wafer 10 and contains Ti, Al, Si, and C as well as a remaining inevitable impurity. SiC wafer 10 includes $n^+$ source region 14 having the n conductivity type and $p^+$ region 18 having the p conductivity type. In addition, each of $n^+$ source region 14 and $p^+$ region 18 is in contact with source contact electrode 16. Source contact electrode 16 contains Al and Ti in the region including the interface with SiC wafer 10. Moreover, source contact electrode 16 is arranged to extend from the region in contact with $n^+$ source region 14 to the region in contact with $p^+$ region 18.

In general, in many cases, Ni is adopted as a material for an electrode in contact with the n-type SiC region. Meanwhile, in a DMOS-type vertical MOSFET including, for example, SiC as a material, a structure in which an electrode composed of Ni is in contact with both of a p-type SiC region and an n-type SiC region is adopted. This is because the DMOS-type vertical MOSFET requires an electrode in contact with both of the p-type region and the n-type region, while an electrode composed of Ni can be in contact also with the p-type SiC region at contact resistivity around $10^{-2}$ $\Omega \cdot cm^2$. Though this contact resistivity of $10^{-2}$ $\Omega \cdot cm^2$ indicates a numeric value allowing use as an ohmic contact electrode, it is not sufficiently low, taking into account the fact that an electrode composed of Ti/Al can be in contact with the p-type SiC region at contact resistivity around $10^{-3}$ $\Omega \cdot cm^2$.

On the other hand, in an example where an electrode composed of Ti/Al is adopted, though contact resistance with the p-type SiC region is sufficiently suppressed, contact resistivity with the n-type SiC region is around $10^{-3}$ $\Omega \cdot cm^2$. This contact resistivity of $10^{-3}$ $\Omega \cdot cm^2$ also indicates a numeric value allowing use as an ohmic contact electrode, however, contact resistance between the electrode composed of Ti/Al and the n-type SiC region is not sufficiently low, taking into account the fact that an electrode composed of Ni can be in contact with the n-type SiC region at contact resistivity around $10^{-6}$ $\Omega \cdot cm^2$.

As a result of further study about a structure of an electrode in consideration of relation between such a structure of an electrode and contact resistance with the p-type SiC region and the n-type SiC region, the present inventor has found that contact resistance with any of the p-type SiC region and the n-type SiC region can sufficiently be suppressed by adopting an ohmic contact electrode containing Ti, Al, Si, and C as well as a remaining inevitable impurity and containing Al and Ti in a region including an interface with the p-type SiC region and the n-type SiC region.

Source contact electrode 16 constituting MOSFET 1 in the present embodiment contains Ti, Al, Si, and C as well as a remaining inevitable impurity and contains Al and Ti in the region including the interface with $n^+$ source region 14 and $p^+$ region 18 formed in SiC wafer 10. Thus, source contact electrode 16 can be in contact with any of $n^+$ source region 14 and $p^+$ region 18 with contact resistance being sufficiently suppressed. Source contact electrode 16 is arranged to extend from the region in contact with $n^+$ source region 14 to the region in contact with $p^+$ region 18. Consequently, MOSFET 1 in the present embodiment is a semiconductor device capable of achieving decrease in the number of steps in a manufacturing process and improvement in integration.

More specifically, in MOSFET 1 in the present embodiment having a DMOS structure, it is necessary to hold $n^+$ source region 14 and p body 13 at the same potential. Therefore, source contact electrode 16 is required to electrically be connected to both of $n^+$ source region 14 and p body 13 with contact resistance being lowered. In addition, in MOSFET 1, in order to lower ON resistance, $n^+$ source region 14 and source contact electrode 16 should electrically be connected to each other with contact resistance being suppressed. In order to meet such requirements and to achieve decrease in the number of steps in a manufacturing process and improvement in integration, source contact electrode 16 extending from the region in contact with $n^+$ source region 14 to the region in contact with p body 13 with contact resistance being lowered is required. In this connection, source contact electrode 16 in MOSFET 1 in the present embodiment is in contact with both of $n^+$ source region 14 and $p^+$ region 18 (p body 13) at low contact resistance, by having the structure above. Consequently, MOSFET 1 is a semiconductor device capable of achieving decrease in the number of steps in a manufacturing process and improvement in integration while achieving higher efficiency.

An operation of MOSFET 1 will now be described. Referring to FIG. 1, in such a state that a voltage not higher than a threshold value is applied to gate electrode 17, that is, in an OFF state, a portion between p body 13 located directly under gate oxide film 15 and $n^-$ SiC layer 12 is reverse-biased and in a non-conducting state. On the other hand, as a positively increasing voltage is applied to gate electrode 17, an inversion layer is formed in a channel region 13A, which is a region around a portion of contact of p body 13 with gate oxide film 15. Consequently, $n^+$ source region 14 and $n^-$ SiC layer 12 are electrically connected to each other and a current flows between source electrode 22 and drain electrode 20.

Figure 2:
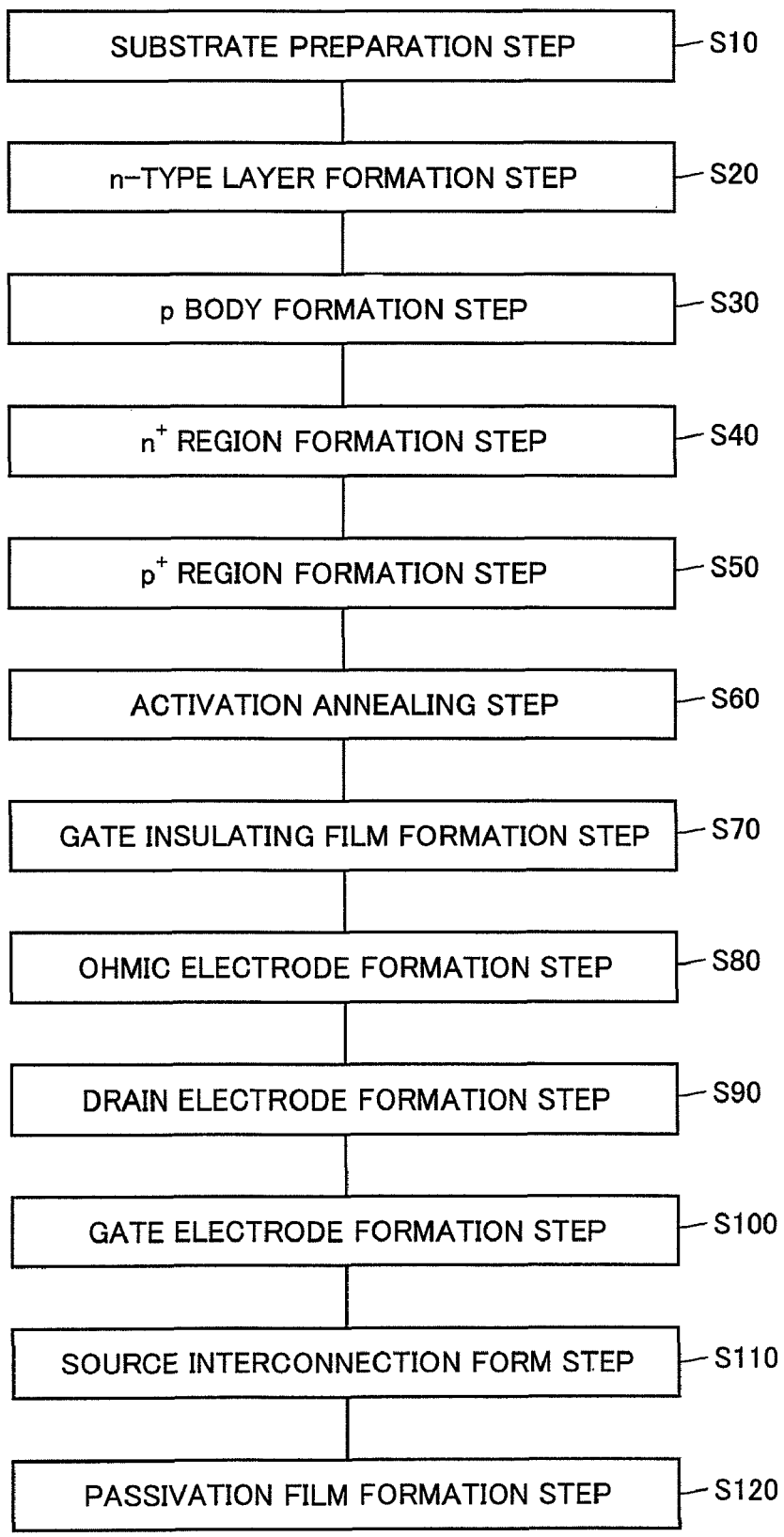
FIG. 2 is a flowchart showing outlines of a method of manufacturing a MOSFET.
Figure 4:
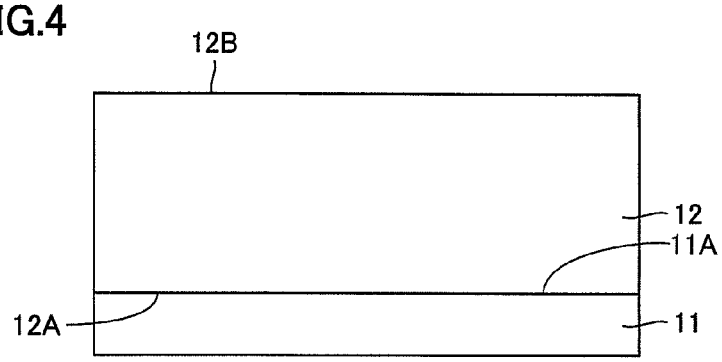
FIG. 4 is a schematic cross-sectional view for illustrating a method of manufacturing a MOSFET.

A method of manufacturing MOSFET 1 in the first embodiment will now be described. Referring to FIG. 2, in the method of manufacturing MOSFET 1 in the first embodiment, initially, in a step (S10), a substrate preparation step is performed. In this step (S10), an SiC substrate of the first conductivity type is prepared. Specifically, referring to FIG. 4, for example, $n^+$ SiC substrate 11 composed of hexagonal SiC and having the n conductivity type by containing an n-type impurity is prepared.

Referring next to FIG. 2, in a step (S20), an n-type layer formation step is performed. In this step (S20), a semiconductor layer of the first conductivity type is formed on $n^+$ SiC substrate 11. Specifically, referring to FIG. 4, $n^-$ SiC layer 12 is formed on one main surface 11A of $n^+$ SiC substrate 11 through epitaxial growth. Epitaxial growth can be achieved, for example, by adopting a gas mixture of $SiH_4$ (silane) and $C_3H_8$ (propane) as a source gas. Here, for example, N is introduced as the n-type impurity. Thus, $n^-$ SiC layer 12 containing an n-type impurity at concentration lower than concentration of an n-type impurity contained in $n^+$ SiC substrate 11 can be formed.

Figure 5:
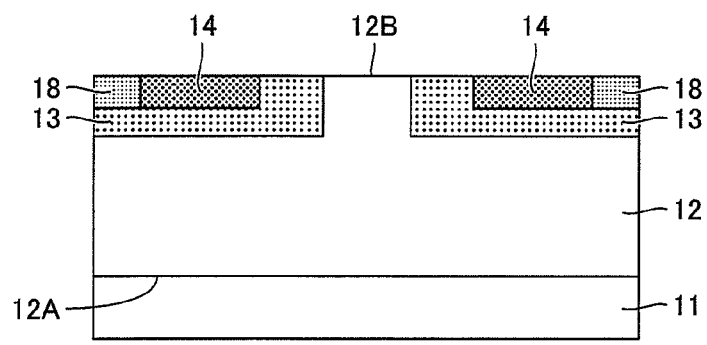
FIG. 5 is a schematic cross-sectional view for illustrating the method of manufacturing a MOSFET.

Referring next to FIG. 2, in a step (S30), a p body formation step is performed. In this step (S30), referring to FIG. 5, a second-conductivity-type region having the second conductivity type is formed so as to include second main surface 12B of $n^-$ SiC layer 12, which is the main surface opposite to first main surface 12A which is the main surface on the $n^+$ SiC substrate 11 side. Specifically, initially, an oxide film composed of SiO$_2$ is formed on second main surface 12B, for example, with CVD (Chemical Vapor Deposition). Then, after a resist is applied onto the oxide film, exposure and development are performed to thereby form a resist film having an opening in a region in conformity with a desired shape of p body 13 serving as the second-conductivity-type region. Using this resist film as a mask, the oxide film is partially removed, for example, through RIE (Reactive Ion Etching), and a mask layer formed of the oxide film having an opening pattern is formed on n$^-$ SiC layer 12. Thereafter, the resist film above is removed. Then, using this mask layer as a mask, ion implantation of a p-type impurity such as Al in n$^-$ SiC layer 12 is performed, to thereby form p body 13 in n$^-$ SiC layer 12.

Referring next to FIG. 2, in a step (S40), an n$^+$ region formation step is performed. In this step (S40), a high-concentration first-conductivity-type region containing an impurity having the first conductivity type at concentration higher than in n$^-$ SiC layer 12 is formed in a region within p body 13 including second main surface 12B. Specifically, referring to FIG. 5, initially, after the oxide film above used as the mask in the step (S30) is removed, a mask layer having an opening in a region in conformity with a desired shape of n$^+$ source region 14 is formed in accordance with a procedure similar to the step (S30). Using this mask layer as a mask, an n-type impurity such as P is introduced in n$^-$ SiC layer 12 through ion implantation, to thereby form n$^+$ source region 14.

Referring next to FIG. 2, in a step (S50), a p$^+$ region formation step is performed. In this step (S50), referring to FIG. 5, a high-concentration second-conductivity-type region (p$^+$ region 18) is formed to include second main surface 12B on the side opposite to n$^+$ source region 14 formed within the other p body 13, when viewed from n$^+$ source region 14 formed within one p body 13 of the pair of p bodies 13. Specifically, referring to FIG. 5, a mask layer having an opening in a region in conformity with a desired shape of p$^+$ region 18 is formed in accordance with a procedure similar to the steps (S30) and (S40), and using this mask layer as a mask, a p-type impurity such as Al or B is introduced in n$^-$ SiC layer 12 through ion implantation, to thereby form p$^+$ region 18.

Referring next to FIG. 2, in a step (S60), an activation annealing step is performed. In this step (S60), activation annealing which is heat treatment for activating an impurity introduced through ion implantation above is performed by heating n$^-$ SiC layer 12 in which ions have been implanted to a temperature around 1700° C., for example, in an Ar (argon) atmosphere and holding the layer for approximately 30 minutes.

Referring next to FIG. 2, in a step (S70), a gate insulating film formation step is performed. In this step (S70), referring to FIG. 6, n$^+$ SiC substrate 11 on which n$^-$ SiC layer 12 including a desired ion implantation region has been formed through the steps (S10) to (S60) is subjected to thermal oxidation. Thermal oxidation can be performed, for example, by heating the substrate to a temperature around 1300° C. in an oxygen atmosphere and holding the substrate for approximately 40 minutes. Thus, a thermal oxide film 15A to serve as gate oxide film 15 (see FIG. 1) composed of silicon dioxide (SiO$_2$) (for example, having a thickness of approximately 50 nm) is formed on second main surface 12B.

Referring next to FIG. 2, in steps (S80) and (S90), an ohmic electrode formation step and a drain electrode formation step are performed. Here, the steps (S80) and (S90) may be performed in this order or in the order of the steps (S90) and (S80), however, from a point of view of decrease in the number of steps, these steps are preferably simultaneously performed as will be described below. In the steps (S80) and (S90), referring to FIG. 3, initially, in steps (S81) to (S83), a Ti film formation step, an Al film formation step and an Si film formation step are performed in this order.

Figure 6:
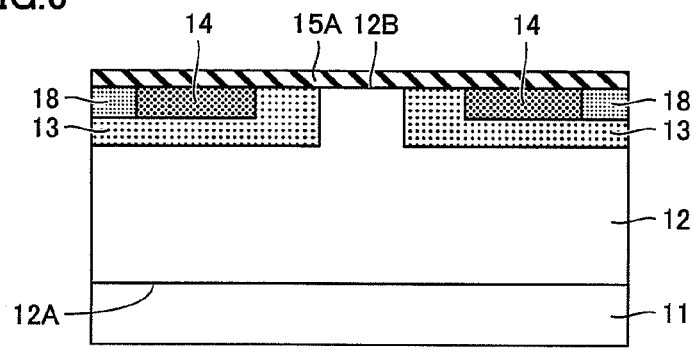
FIG. 6 is a schematic cross-sectional view for illustrating the method of manufacturing a MOSFET.
Figure 7:
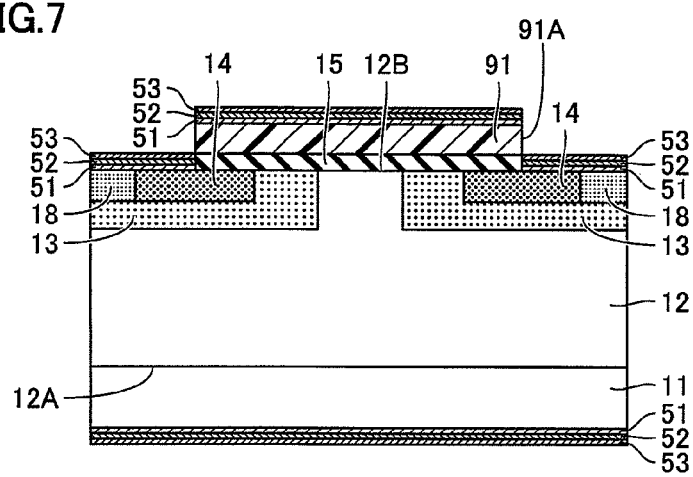
FIG. 7 is a schematic cross-sectional view for illustrating the method of manufacturing a MOSFET.
Figure 8:
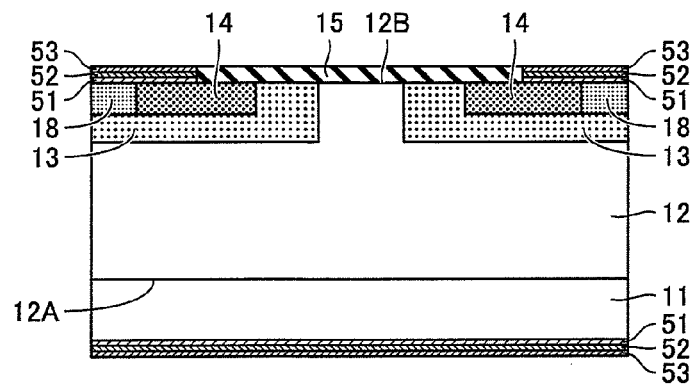
FIG. 8 is a schematic cross-sectional view for illustrating the method of manufacturing a MOSFET.

Specifically, referring to FIGS. 6 and 7, initially, after a resist is applied onto thermal oxide film 15A, exposure and development are performed to thereby form a resist film 91 having an opening 91A in conformity with a region where source contact electrode 16 (see FIG. 1) is to be formed. Then, using resist film 91 as a mask, gate oxide film 15 is formed as a result of partial removal of thermal oxide film 15A, for example, through RIE. Thereafter, as shown in FIG. 7, a Ti film 51 composed of Ti, an Al film 52 composed of Al, and an Si film 53 composed of Si are formed in this order on second main surface 12B and on the main surface of n$^+$ SiC substrate 11 opposite to n$^-$ SiC layer 12, for example, through sputtering. In addition, as a result of removal of resist film 91, Ti film 51, Al film 52 and Si film 53 on resist film 91 are removed (lifted off), so that Ti film 51, Al film 52 and Si film 53 remain on second main surface 12B exposed through gate oxide film 15 and on the main surface of n$^+$ SiC substrate 11 opposite to n$^-$ SiC layer 12 as shown in FIG. 8.

Here, in the step (S81), Ti film 51 having a thickness not smaller than 100 Å and not greater than 400 Å is preferably formed. Thus, an ohmic contact electrode having low resistance in a stable manner can be formed. In addition, in the step (S82), Al film 52 at least 1.5 times and at most 6 times as thick as Ti film 51 formed in the step (S51) is preferably formed. Thus, source contact electrode 16 further reliably achieving low contact resistance with n$^+$ source region 14 and p body 13 can be fabricated. Moreover, in the step (S83), Si film 53 having a thickness not smaller than 100 Å and not greater than 500 Å is preferably formed. Thus, an ohmic contact electrode having low resistance in a stable manner can be formed.

Figure 3:
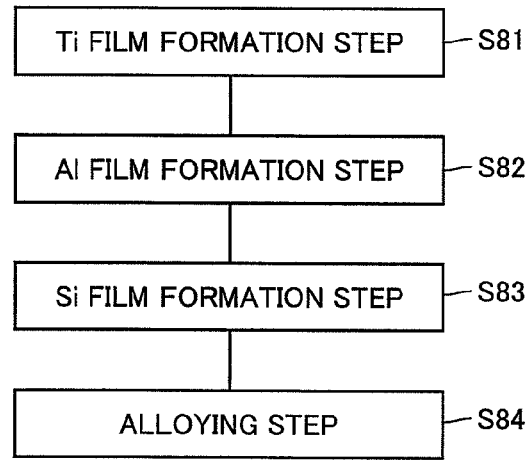
FIG. 3 is a flowchart showing details of an ohmic electrode formation step and a drain electrode formation step in FIG. 2.
Figure 9:
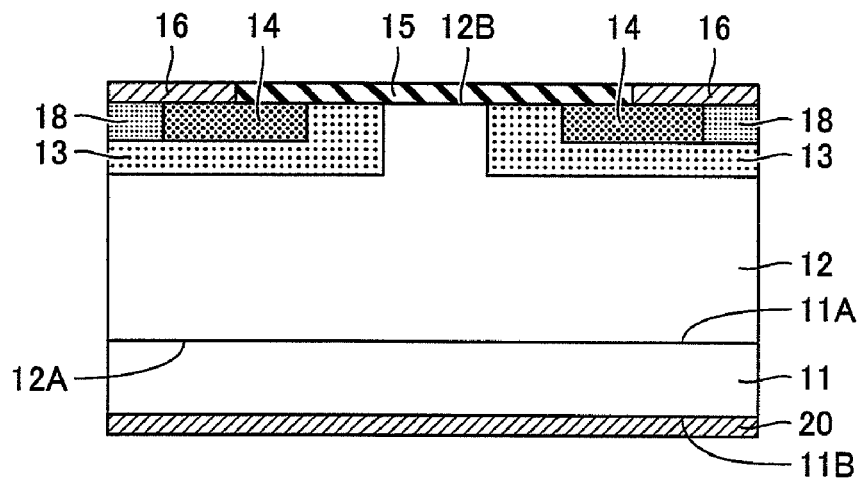
FIG. 9 is a schematic cross-sectional view for illustrating the method of manufacturing a MOSFET.

Referring next to FIG. 3, in a step (S84), an alloying step is performed. Specifically, referring to FIGS. 8 and 9, heat treatment is performed, in which heating to a temperature not lower than 550° C. and not higher than 1200° C., preferably not lower than 900° C. and not higher than 1100° C., for example 1000° C., in an atmosphere of an inert gas such as Ar is carried out and holding for a time period not longer than 10 minutes, for example 2 minutes, is carried out. Thus, Ti, Al and Si contained in Ti film 51, Al film 52 and Si film 53 respectively as well as Si and C contained in n$^-$ SiC layer 12 or n$^+$ SiC substrate 11 are alloyed. Consequently, as shown in FIG. 9, source contact electrode 16 arranged in contact with second main surface 12B, extending from the pair of n$^+$ source regions 14 in a direction away from gate oxide film 15 to p$^+$ region 18 and drain electrode 20 arranged in contact with the other main surface 11B of n$^+$ SiC substrate 11, which is the main surface opposite to one main surface 11A which is the main surface on the side where n$^-$ SiC layer 12 is formed, are formed. Here, in the step (S84), n$^+$ SiC substrate 11 is preferably heated in a gas mixture of an inert gas, in particular, Ar and/or N$_2$, and hydrogen. Thus, source contact electrode 16, with its contact resistance with n$^+$ source region 14 and p body 13 (p$^+$ region 18) being further reliably lowered and manufacturing cost being suppressed, can be fabricated. The steps (S80) and (S90) are completed in the procedure above.

Referring next to FIG. 2, in a step (S100), a gate electrode formation step is performed. In this step (S100), gate electrode 17 (see FIG. 1) composed of a conductor such as polysilicon or Al is formed to be in contact with gate oxide film 15 and to extend from one n$^+$ source region 14 to the other n$^+$ source region 14 over the same. In an example where polysilicon is adopted as a material for a gate electrode, polysilicon can contain P at high concentration exceeding $1 \times 10^{20}$ cm$^{-3}$.

Referring next to FIG. 2, in a step (S110), a source interconnection formation step is performed. In this step (S110), source interconnection 19 (see FIG. 1) composed of a conductor such as Al is formed on the upper surface of source contact electrode 16, for example, with a vapor deposition method. Source electrode 22 (see FIG. 1) is completed in the step (S80) described above and this step (S110).

Referring next to FIG. 2, in a step (S120), a passivation film formation step is performed. In this step (S120), referring to FIG. 1, this passivation film 21 composed, for example, of $SiO_2$, is formed to extend from one source interconnection 19 over gate electrode 17 to the other source interconnection 19. This passivation film 21 can be formed, for example, with a CVD method. MOSFET 1 (see FIG. 1) in the first embodiment is completed through the steps (S10) to (S120) above.

According to the method of manufacturing a MOSFET in the first embodiment, above-described source contact electrode 16 that can be in contact with any of $p^+$ region 18 and $n^+$ source region 14 with contact resistance being sufficiently suppressed can be formed to extend from the region in contact with the n-type region to the region in contact with the p-type region and drain electrode 20 made of a material the same as that for source contact electrode 16 can be formed simultaneously therewith. Consequently, decrease in the number of steps in the process for manufacturing MOSFET 1 and improvement in integration of MOSFET 1 can be achieved.

(Second Embodiment)

A second embodiment representing another embodiment of the present invention will now be described. MOSFET 1 representing a semiconductor device in the second embodiment is basically structured similarly to MOSFET 1 in the first embodiment above and achieves similar effects. In addition, MOSFET 1 in the second embodiment has features different from those in the first embodiment, as follows.

Namely, referring to FIG. 1, source contact electrode 16 constituting MOSFET 1 in the second embodiment contains Ti, Al, Si, and C as well as a remaining inevitable impurity, and contains Si in a region including a surface opposite to SiC wafer 10. By thus containing silicon (Si) in the region including the surface opposite to SiC wafer 10, source contact electrode 16 can be in contact with any of $p^+$ region 18 and $n^+$ source region 14 with contact resistance being sufficiently suppressed. In addition, source contact electrode 16 is arranged to extend from the region in contact with $n^+$ source region 14 to the region in contact with $p^+$ region 18. Consequently, MOSFET 1 in the present embodiment is a semiconductor device capable of achieving decrease in the number of steps in a manufacturing process and improvement in integration.

In addition, referring to FIG. 1, in MOSFET 1 in the present embodiment, in source contact electrode 16, a content of Si in source contact electrode 16 preferably monotonously increases toward SiC wafer 10. Thus, Si is present in the entire area in a direction of thickness of source contact electrode 16 which is an ohmic contact electrode and the content of Si becomes higher toward SiC wafer 10 containing Si. Consequently, contact resistance between source contact electrode 16 and $p^+$ region 18, $n^+$ source region 14 can more reliably be lowered.

Moreover, in MOSFET 1 in the present embodiment, a content of Al in source contact electrode 16 preferably monotonously decreases toward SiC wafer 10. Thus, Al is present as far as a region including an interface between source contact electrode 16 and $p^+$ region 18, $n^+$ source region 14, and hence contact resistance between source contact electrode 16 and $p^+$ region 18, $n^+$ source region 14 can more reliably be lowered.

Further, in MOSFET 1 in the present embodiment, a content of Ti in source contact electrode 16 preferably monotonously increases from the surface opposite to SiC wafer 10 toward SiC wafer 10 and attains to a maximum value, and thereafter monotonously decreases. As Ti thus distributes in source contact electrode 16 and it is present in the entire area in the direction of thickness, contact resistance between source contact electrode 16 and $p^+$ region 18, $n^+$ source region 14 can more reliably be lowered.

It is noted that MOSFET 1 in the second embodiment can be manufactured with a manufacturing method the same as that for MOSFET 1 in the first embodiment.

(Third Embodiment)

A third embodiment representing yet another embodiment of the present invention will now be described. MOSFET 1 representing a semiconductor device in the third embodiment is basically structured similarly to MOSFET 1 in the first embodiment above and achieves similar effects. In addition, MOSFET 1 in the third embodiment has features different from those in the first embodiment, as follows.

Namely, referring to FIG. 1, source contact electrode 16 constituting MOSFET 1 in the third embodiment contains Ti, Al, Si, and C as well as a remaining inevitable impurity, and a content of Al therein monotonously decreases toward SiC wafer 10 and a content of Si therein monotonously increases toward SiC wafer 10. As Al and Si thus distribute and they are present in the entire area in a direction of thickness, source contact electrode 16 can be in contact with any of $p^+$ region 18 and $n^+$ source region 14 with contact resistance being sufficiently suppressed. In addition, source contact electrode 16 is arranged to extend from the region in contact with $n^+$ source region 14 to the region in contact with $p^+$ region 18. Consequently, MOSFET 1 in the present embodiment is a semiconductor device capable of achieving decrease in the number of steps in a manufacturing process and improvement in integration.

In addition, referring to FIG. 1, in MOSFET 1 in the present embodiment, a content of Ti in source contact electrode 16 preferably monotonously increases from the surface opposite to SiC wafer 10 toward SiC wafer 10 and attains to a maximum value, and thereafter monotonously decreases. As Ti thus distributes in source contact electrode 16 and it is present in the entire area in the direction of thickness, contact resistance between source contact electrode 16 and $p^+$ region 18, $n^+$ source region 14 can more reliably be lowered.

It is noted that MOSFET 1 in the third embodiment can be manufactured with a manufacturing method the same as that for MOSFET 1 in the first embodiment.

Further, two or more features of source contact electrode 16 described in the first to third embodiments above may simultaneously be achieved in any combination.

(Fourth Embodiment)

Figure 10:
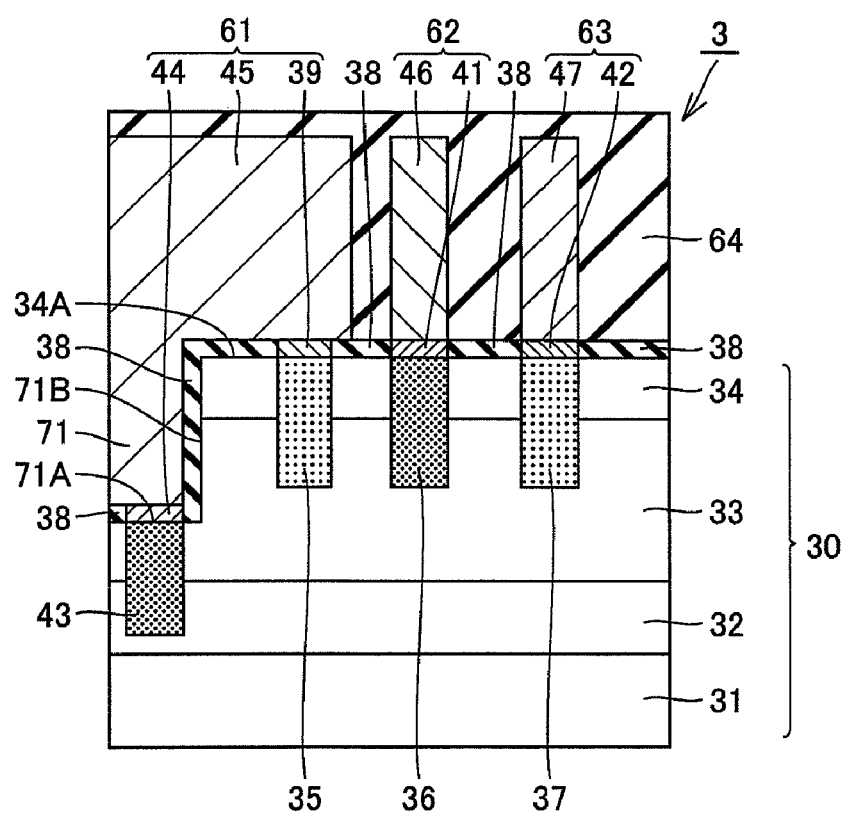
FIG. 10 is a schematic cross-sectional view showing a structure of a JFET.

A fourth embodiment representing yet another embodiment of the present invention will now be described. Referring to FIG. 10, a JFET 3 which is a junction field effect transistor representing a semiconductor device in the fourth embodiment is the same as MOSFET 1 in the first to third embodiments above in a structure of an ohmic contact electrode and achieves similar effects. Specifically, JFET 3 includes an n-type substrate 31 composed of SiC and having the n conductivity type, a first p-type layer 32 formed on n-type substrate 31, an n-type layer 33 formed on first p-type layer 32, and a second p-type layer 34 formed on n-type layer 33. In addition, n-type substrate 31, p-type layer 32, n-type layer 33, and second p-type layer 34 constitute an SiC wafer 30 composed of silicon carbide. Here, the p-type layer and the n-type layer are layers composed of SiC and having the p and n conductivity types, respectively. In addition, for example, first p-type layer 32 can have a thickness of approximately 10 μm and concentration of a p-type impurity of approximately $7.5 \times 10^{15}$ cm$^{-3}$. For example, n-type layer 33 can have a thickness of approximately 0.45 μm and concentration of an n-type impurity of approximately $2 \times 10^{17}$ cm$^{-3}$. For example, second p-type layer 34 can have a thickness of approximately 0.25 μm and concentration of a p-type impurity of approximately $2 \times 10^{17}$ cm$^{-3}$.

In second p-type layer 34 and n-type layer 33, a first n-type region 35 and a second n-type region 37 containing an impurity having the n conductivity type (the n-type impurity) at concentration higher than in n-type layer 33 (for example, approximately $1 \times 10^{20}$ cm$^{-3}$) are formed, and a first p-type region 36 containing an impurity having the p conductivity type (the p-type impurity) at concentration higher than in first p-type layer 32 and second p-type layer 34 (for example, approximately $1 \times 10^{18}$ cm$^{-3}$) is formed such that it lies between first n-type region 35 and second n-type region 37. Namely, first n-type region 35, first p-type region 36 and second n-type region 37 are formed to reach n-type layer 33 through second p-type layer 34. In addition, a bottom portion of each of first n-type region 35, first p-type region 36 and second n-type region 37 is arranged at a distance from an upper surface of first p-type layer 32 (a boundary portion between first p-type layer 32 and n-type layer 33).

On the side opposite to first p-type region 36 when viewed from first n-type region 35, a groove portion 71 is formed to extend from an upper surface 34A of second p-type layer 34 (a main surface opposite to the n-type layer 33 side) through second p-type layer 34 to reach n-type layer 33. Namely, a bottom wall 71A of groove portion 71 is located inside n-type layer 33, at a distance from an interface between first p-type layer 32 and n-type layer 33. In addition, a second p-type region 43 containing a p-type impurity at concentration higher than in first p-type layer 32 and second p-type layer 34 (for example, approximately $1 \times 10^{18}$ cm$^{-3}$) is formed to extend from bottom wall 71A of groove portion 71 through n-type layer 33 to reach first p-type layer 32. A bottom portion of this second p-type region 43 is arranged at a distance from an upper surface of n-type substrate 31 (a boundary portion between n-type substrate 31 and first p-type layer 32).

In addition, a source contact electrode 39, a gate contact electrode 41, a drain contact electrode 42, and a potential-holding contact electrode 44 serving as ohmic contact electrodes are formed in contact with upper surfaces of first n-type region 35, first p-type region 36, second n-type region 37, and second p-type region 43, respectively. Source contact electrode 39, gate contact electrode 41, drain contact electrode 42, and potential-holding contact electrode 44 have features similar to that of source contact electrode 16 in the first to third embodiments.

An oxide film 38 is formed between each of source contact electrode 39, gate contact electrode 41, drain contact electrode 42, and potential-holding contact electrode 44 serving as ohmic contact electrodes and adjacent another ohmic contact electrode. More specifically, oxide film 38 serving as an insulating film is formed on upper surface 34A of second p-type layer 34 and on bottom wall 71A and a sidewall 71B of groove portion 71, so as to cover the entire region other than regions where source contact electrode 39, gate contact electrode 41, drain contact electrode 42, and potential-holding contact electrode 44 are formed. Adjacent ohmic contact electrodes are thus isolated from each other.

Further, a source interconnection 45, a gate interconnection 46 and a drain interconnection 47 are formed to be in contact with the upper surfaces of source contact electrode 39, gate contact electrode 41 and drain contact electrode 42, respectively, and they are electrically connected to the ohmic contact electrodes. Source interconnection 45 is also in contact with an upper surface of potential-holding contact electrode 44, and hence it is also electrically connected to potential-holding contact electrode 44. Namely, source interconnection 45 is formed to extend from the upper surface of source contact electrode 39 to the upper surface of potential-holding contact electrode 44, and thus potential-holding contact electrode 44 is held at a potential as high as source contact electrode 39. Source interconnection 45, gate interconnection 46 and drain interconnection 47 are made of a conductor such as Al. Source contact electrode 39 and source interconnection 45 constitute a source electrode 61, gate contact electrode 41 and gate interconnection 46 constitute a gate electrode 62, and drain contact electrode 42 and drain interconnection 47 constitute a drain electrode 63. Furthermore, a passivation film 64 is formed to cover upper surfaces of source electrode 61, gate electrode 62, drain electrode 63, and oxide film 38. This passivation film 64 is made, for example, of SiO$_2$, and it has a function to electrically isolate source electrode 61, gate electrode 62 and drain electrode 63 from the outside and to protect JFET 3.

Namely, JFET 3 in the present embodiment includes SiC wafer 30, as well as source contact electrode 39, gate contact electrode 41, drain contact electrode 42, and potential-holding contact electrode 44 serving as ohmic contact electrodes, that are arranged in contact with SiC wafer 30 and contain Ti, Al, Si, and C as well as a remaining inevitable impurity. SiC wafer 30 includes first n-type region 35 and second n-type region 37 having the n conductivity type and first p-type region 36 and second p-type region 43 having the p conductivity type. In addition, source contact electrode 39 and drain contact electrode 42 among the ohmic contact electrodes above are in contact with first n-type region 35 and second n-type region 37 respectively, and gate contact electrode 41 and potential-holding contact electrode 44 are in contact with first p-type region 36 and second p-type region 43 respectively. Source contact electrode 39, gate contact electrode 41, drain contact electrode 42, and potential-holding contact electrode 44 have features similar to that of source contact electrode 16 in the first to third embodiments.

In JFET 3 in the present embodiment, source contact electrode 39 and drain contact electrode 42 having features similar to that of source contact electrode 16 in the first to third embodiments are in contact with first n-type region 35 and second n-type region 37 each of which is an n-type region, and gate contact electrode 41 made of a material the same as that for source contact electrode 39 and drain contact electrode 42 is arranged in contact with first p-type region 36 and second p-type region 43 each of which is a p-type region. Thus, JFET 3 is a semiconductor device capable of achieving decrease in the number of steps in a manufacturing process and improvement in integration.

More specifically, in JFET 3 in the present embodiment, in an example where Ni is used as a material for forming source contact electrode 39 and drain contact electrode 42 arranged in contact with first n-type region 35 and second n-type region 37 respectively and Ti/Al is used as a material for forming gate contact electrode 41 arranged in contact with first p-type region 36 as in a conventional JFET, the following problem arises. Namely, in a method of manufacturing JFET 3 adopting the structure above, after a mask for forming source contact electrode 39 and drain contact electrode 42 is formed, these electrodes are formed with vapor deposition or the like. Thereafter, after the mask is removed, it is necessary to further form a mask for forming gate contact electrode 41 and to form this electrode with vapor deposition or the like. If such a manufacturing process is adopted, the number of steps increases and improvement in integration is interfered because of registration error in forming masks twice. In contrast, in JFET 3 in the present embodiment, since source contact electrode 39, gate contact electrode 41 and drain contact electrode 42 can be formed with the same material, these electrodes can collectively be formed by forming a mask once. Consequently, JFET 3 in the present embodiment can achieve decrease in the number of steps in a manufacturing process and improvement in integration.

An operation of JFET 3 will now be described. Referring to FIG. 10, while a voltage of gate electrode 62 is set to 0V, a region lying between first p-type region 36 and second n-type region 37 and a region lying between the former region and first p-type layer 32 (a drift region) in n-type layer 33 as well as a region lying between first p-type region 36 and first p-type layer 32 (a channel region) are not depleted, and hence first n-type region 35 and second n-type region 37 are electrically connected to each other through n-type layer 33. Therefore, electrons migrate from first n-type region 35 toward second n-type region 37, whereby a current flows.

Meanwhile, as a voltage increasing in a negative direction is applied to gate contact electrode 41, depletion of the channel region and the drift region described above proceeds and first n-type region 35 and second n-type region 37 are electrically disconnected from each other. Therefore, electrons cannot migrate from first n-type region 35 toward second n-type region 37, whereby no current flows.

Figure 11:
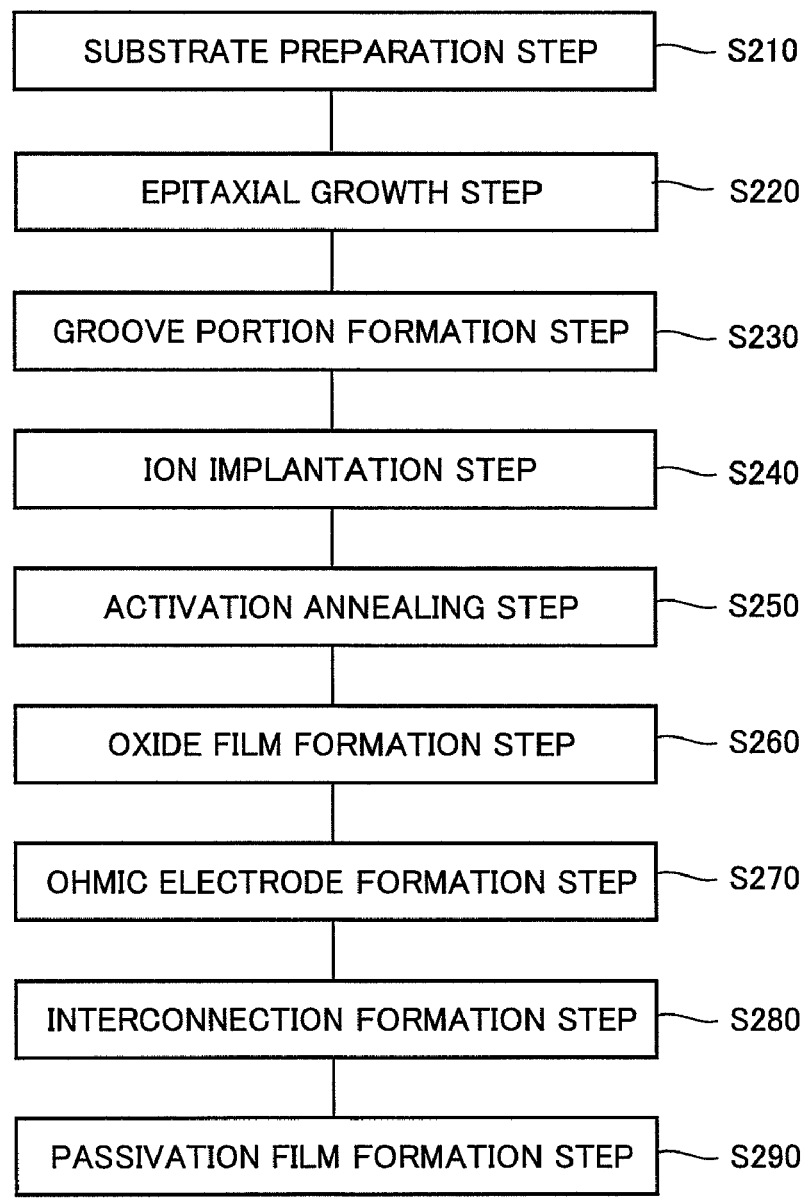
FIG. 11 is a flowchart showing outlines of a method of manufacturing a JFET.
Figure 12:
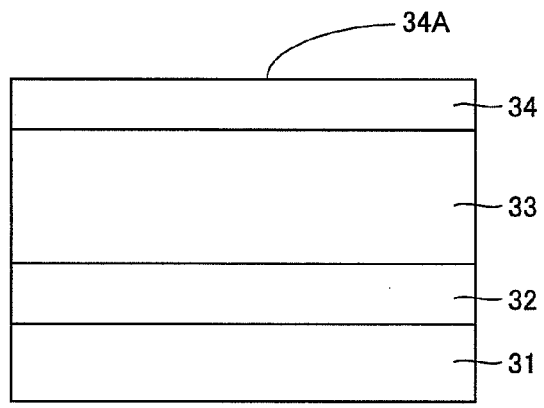
FIG. 12 is a schematic cross-sectional view for illustrating a method of manufacturing a JFET.

A method of manufacturing JFET 3 representing a semiconductor device in the fourth embodiment will now be described. Referring to FIG. 11, in the method of manufacturing JFET 3 in the present embodiment, initially, in a step (S210), a substrate preparation step is performed. Specifically, in the step (S210), as shown in FIG. 12, n-type substrate 31 containing an n-type impurity at high concentration and composed of SiC is prepared. Thereafter, in a step (S220), an epitaxial growth step is performed. Specifically, first p-type layer 32, n-type layer 33 and second p-type layer 34 composed of SiC are successively formed on one main surface of n-type substrate 31, for example, through vapor-phase epitaxial growth. In vapor-phase epitaxial growth, for example, a silane ($SiH_4$) gas and a propane ($C_3H_8$) gas can be used as a source gas, and a hydrogen ($H_2$) gas can be adopted as a carrier gas. In addition, for example, diborane ($B_2H_6$) or trimethylaluminum (TMA) can be adopted as a p-type impurity source for forming a p-type layer, and for example, nitrogen ($N_2$) can be adopted as an n-type impurity for forming an n-type layer. Thus, first p-type layer 32 and second p-type layer 34 containing a p-type impurity such as Al or B and n-type layer 33 containing an n-type impurity such as N are formed.

Figure 13:
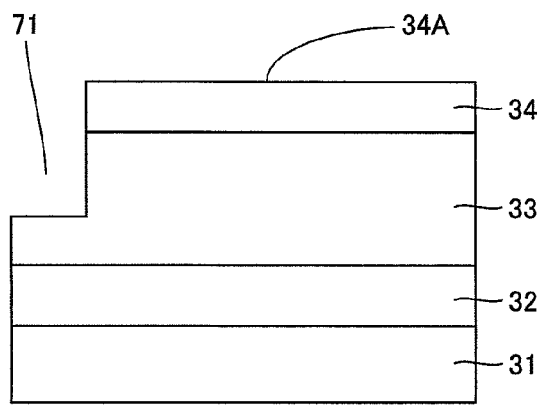
FIG. 13 is a schematic cross-sectional view for illustrating the method of manufacturing a JFET.

Referring next to FIG. 11, in a step (S230), a groove portion formation step is performed. Specifically, in the step (S230), as shown in FIG. 13, groove portion 71 is formed to extend from upper surface 34A of second p-type layer 34 through second p-type layer 34 to reach n-type layer 33. Groove portion 71 is formed in such a manner that, for example, a mask layer having an opening at a desired position where groove portion 71 is to be formed is formed on upper surface 34A of second p-type layer 34 and thereafter dry etching using $SF_6$ gas is performed.

Figure 14:
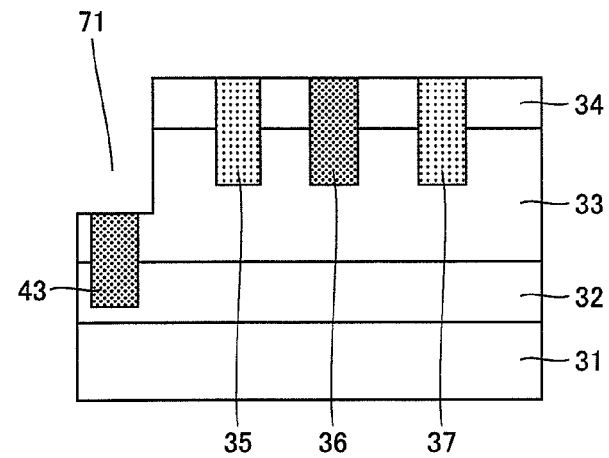
FIG. 14 is a schematic cross-sectional view for illustrating the method of manufacturing a JFET.

Referring next to FIG. 11, in a step (S240), an ion implantation step is performed. Specifically, in the step (S240), referring to FIGS. 13 and 14, initially, an oxide film composed of $SiO_2$ is formed on upper surface 34A of second p-type layer 34 and on the bottom wall of groove portion 71, for example, with CVD. Then, after a resist is applied onto the oxide film, exposure and development are performed to thereby form a resist film having openings in regions in conformity with desired shapes of first n-type region 35 and second n-type region 37. Then, using the resist film as a mask, the oxide film is partially removed, for example, through RIE, and a mask layer having an opening pattern and formed of the oxide film is formed on upper surface 34A of second p-type layer 34. Thereafter, the resist film above is removed, and using this mask layer as a mask, ion implantation in n-type layer 33 and second p-type layer 34 is performed. A type of ions to be implanted includes, for example, P, N and the like. First n-type region 35 and second n-type region 37 reaching n-type layer 33 through second p-type layer 34 are thus formed.

In addition, after the mask layer used for forming first n-type region 35 and second n-type region 37 is removed, in accordance with a similar procedure, a mask layer having openings in regions in conformity with desired shapes of first p-type region 36 and second p-type region 43 is formed on upper surface 34A of second p-type layer 34 and on the bottom wall of groove portion 71. Then, using this mask layer as a mask, ion implantation in first p-type layer 32, n-type layer 33 and second p-type layer 34 is performed. A type of ions to be implanted includes, for example, Al, B and the like. First p-type region 36 reaching n-type layer 33 through second p-type layer 34 and second p-type region 43 reaching first p-type layer 32 through n-type layer 33 from bottom wall 71A of groove portion 71 are thus formed.

Referring next to FIG. 11, in a step (S250), an activation annealing step is performed. Specifically, in the step (S250), n-type substrate 31 having first p-type layer 32, n-type layer 33 and second p-type layer 34 in which ion implantation above has been completed is subjected to activation annealing in such a manner that n-type substrate 31 is heated to 1700° C. in an atmosphere of an inert gas such as argon and held for 30 minutes. Thus, an impurity such as P or Al introduced in the step (S240) is activated and it can function as the n-type impurity or the p-type impurity.

Figure 15:
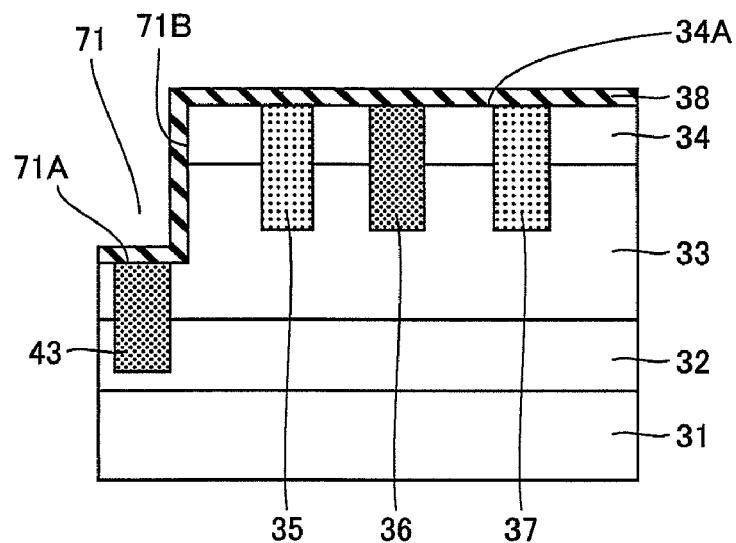
FIG. 15 is a schematic cross-sectional view for illustrating the method of manufacturing a JFET.

Referring next to FIG. 11, in a step (S260), an oxide film formation step is performed. Specifically, in the step (S260), referring to FIG. 15, thermal oxidation treatment, for example, in which heating to a temperature around 1300° C. in an oxygen atmosphere and holding for approximately 90 minutes is carried out, is performed so that oxide film 38 serving as an insulating film (a field oxide film) covering upper surface 34A of second p-type layer 34 as well as bottom wall 71A and sidewall 71B of groove portion 71 is formed. Oxide film 38 has a thickness, for example, of approximately 0.1 μm.

Figure 16:
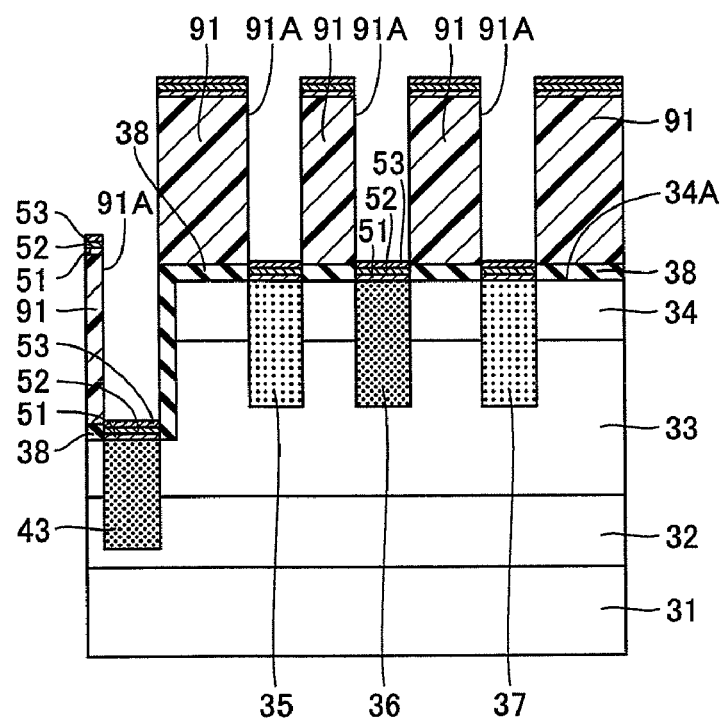
FIG. 16 is a schematic cross-sectional view for illustrating the method of manufacturing a JFET.

Referring next to FIG. 11, in a step (S270), an ohmic electrode formation step is performed. This step (S270) can be performed similarly to the step (S80) in the first embodiment. Specifically, referring to FIG. 16, initially, after a resist is applied onto oxide film 38, exposure and development are performed to thereby form resist film 91 having opening 91A in conformity with regions where source contact electrode 39, gate contact electrode 41, drain contact electrode 42, and potential-holding contact electrode 44 (see FIG. 10) are to be formed. Then, using resist film 91 as a mask, oxide film 38 is partially removed, for example, through RIE. Thereafter, as in the steps (S81) to (S83) in the first embodiment, Ti film 51 composed of Ti, Al film 52 composed of Al and Si film 53 composed of Si are formed on resist film 91 and in a region exposed through resist film 91. In addition, as a result of removal of resist film 91, Ti film 51, Al film 52 and Si film 53 on resist film 91 are removed (lifted off), so that Ti film 51, Al film 52 and Si film 53 remain in contact with first n-type region 35, first p-type region 36, second n-type region 37, and second p-type region 43.

Figure 17:
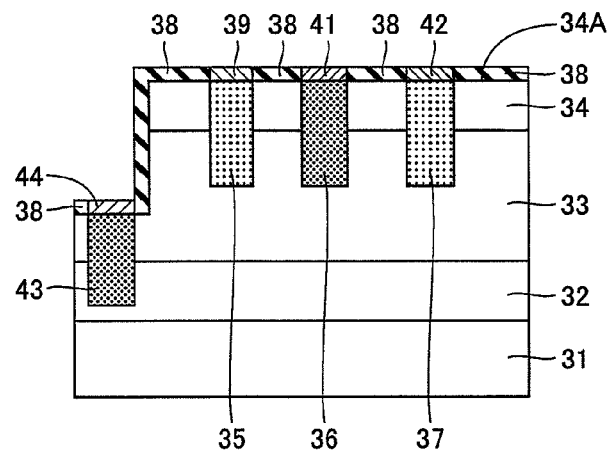
FIG. 17 is a schematic cross-sectional view for illustrating the method of manufacturing a JFET.

Thereafter, as in the step (S84) in the first embodiment, alloying is performed. Specifically, referring to FIG. 17, alloying treatment in which heating to a temperature not lower than 550° C. and not higher than 1200° C., preferably not lower than 900° C. and not higher than 1100° C., for example 1000° C., in an atmosphere of an inert gas such as Ar is carried out and holding for a time period not longer than 10 minutes, for example, 2 minutes, is carried out, is performed. Thus, Ti, Al and Si contained in Ti film 51, Al film 52 and Si film 53 respectively as well as Si and C contained in n-type layer 33 or second p-type layer 34 are alloyed. Consequently, as shown in FIG. 17, source contact electrode 39, gate contact electrode 41, drain contact electrode 42, and potential-holding contact electrode 44 serving as the ohmic contact electrodes are formed in contact with the upper surfaces of first n-type region 35, first p-type region 36, second n-type region 37, and second p-type region 43 respectively. Here, heating above is preferably performed in a gas mixture of an inert gas, in particular, Ar and/or $N_2$, and hydrogen. Thus, source contact electrode 39, gate contact electrode 41, and drain contact electrode 42 can be fabricated with manufacturing cost being suppressed and contact resistance being suppressed. The step (S270) is completed in the procedure above.

Referring next to FIG. 11, in a step (S280), an interconnection formation step is performed. Specifically, in the step (S280), referring to FIG. 10, source interconnection 45, gate interconnection 46 and drain interconnection 47 in contact with the upper surfaces of source contact electrode 39, gate contact electrode 41 and drain contact electrode 42 respectively are formed. Source interconnection 45, gate interconnection 46 and drain interconnection 47 can be formed, for example, by forming a resist layer having openings in desired regions where source interconnection 45, gate interconnection 46 and drain interconnection 47 are to be formed, vapor-depositing Al, and thereafter removing (lifting off) Al on the resist layer together with the resist layer.

Referring next to FIG. 11, in a step (S290), a passivation film formation step is performed. Specifically, in the step (S290), passivation film 64 composed, for example, of $SiO_2$ is formed to cover the upper surfaces of source electrode 61, gate electrode 62, drain electrode 63, and oxide film 38. This passivation film 64 can be formed, for example, with CVD.

Through the steps above, JFET 3 in the present embodiment is completed. Here, in the method of manufacturing JFET 3 representing a semiconductor device in the present embodiment above, since source contact electrode 39, gate contact electrode 41 and drain contact electrode 42 can be formed with the same material, these electrodes can simultaneously be formed by forming a mask once. Consequently, the method of manufacturing JFET 3 in the present embodiment can achieve decrease in the number of steps in a manufacturing process and improvement in integration.

In the embodiments above, a MOSFET and a JFET have been described by way of example of a semiconductor device according to the present invention, however, a semiconductor device according to the present invention is not limited thereto and other semiconductor devices such as an IGBT (Insulated Gate Bipolar Transistor) and a bipolar transistor are also applicable.

EXAMPLE 1

Example 1 of the present invention will be described hereinafter. An experiment was conducted for comparing contact resistance with an SiC layer, among an ohmic contact electrode included in the semiconductor device according to the present invention (Example), an Ni electrode (Comparative Example A) and a Ti/Al electrode (Comparative Example B) representing conventional ohmic contact electrodes out of the scope of the present invention. A procedure in the experiment is as follows.

Initially, an SiC substrate was prepared, and an n-type SiC region containing P representing an n-type impurity at concentration of $6 \times 10^{19}$ $cm^{-3}$ and a p-type SiC region containing Al representing a p-type impurity at concentration of $5 \times 10^{19}$ $cm^{-3}$ were formed in the SiC substrate through ion implantation. Then, an ohmic contact electrode was formed to be in contact with the n-type SiC region and the p-type SiC region with a method similar to that in the first embodiment above and contact resistivity was measured (Example). For comparison, an electrode composed of Ni (Comparative Example A) and an electrode composed of Ti/Al (Comparative Example B) were also formed to be in contact with the n-type SiC region and the p-type SiC region and contact resistivity was measured. Results of measurement are shown in Table 1.

TABLE 1

|  | Contact Resistivity with n-Type SiC Region ($\Omega \cdot cm^2$) | Contact Resistivity with p-Type SiC Region ($\Omega \cdot cm^2$) |
| --- | --- | --- |
| Comparative Example A | $5 \times 10^{-6}$ | $2 \times 10^{-2}$ |
| Comparative Example B | $3 \times 10^{-3}$ | $2 \times 10^{-3}$ |
| Example | $7 \times 10^{-6}$ | $3 \times 10^{-3}$ |

Referring to Table 1, though the electrode composed of Ni in Comparative Example A can be in contact with the n-type SiC region at low contact resistivity of $5 \times 10^{-6}$ $\Omega \cdot cm^2$, contact resistivity with the p-type SiC region is $2 \times 10^{-2}$ $\Omega \cdot cm^2$, which is not sufficiently low. On the other hand, though the electrode composed of Ti/Al in Comparative Example B can be in contact with the p-type SiC region at low contact resistivity of $2 \times 10^{-3}$ $\Omega \cdot cm^2$, contact resistivity with the n-type SiC region is $3 \times 10^{-3}$ $\Omega \cdot cm^2$, which is not sufficiently low.

In contrast, the electrode in Example having a structure similar to that of the ohmic contact electrode included in the semiconductor device according to the present invention has contact resistance with the n-type SiC region of $7 \times 10^{-6}$ $\Omega \cdot cm^2$, which is comparable to that of Ni and has contact resistance with the p-type SiC region of $3 \times 10^{-3}$ $\Omega \cdot cm^2$, which is comparable to that of Ti/Al. It was thus confirmed that the ohmic contact electrode included in the semiconductor device according to the present invention can achieve sufficiently suppressed contact resistance with any of the p-type SiC region and the n-type SiC region.

EXAMPLE 2

Example 2 of the present invention will be described hereinafter. An experiment was conducted for examining influence of a composition of an ohmic contact electrode on contact resistance with a p-type SiC region and an n-type SiC region, with regard to the ohmic contact electrode included in the semiconductor device according to the present invention. A procedure in the experiment is as follows.

Initially, an SiC substrate was prepared, and as in Example 1 above, an n-type SiC region containing P representing an n-type impurity at concentration of $6 \times 10^{19}$ $cm^{-3}$ and a p-type SiC region containing Al representing a p-type impurity at concentration of $5\times10^{19}$ cm$^{-3}$ were formed in the SiC substrate through ion implantation. Then, an ohmic contact electrode was formed to be in contact with the n-type SiC region and the p-type SiC region with a method similar to that in the first embodiment above and contact resistivity was measured. Here, an experiment in which a composition of an ohmic contact electrode was varied by varying a thickness of an Al film with a thickness of a Ti film being fixed to 200 Å and a thickness of an Si film being fixed to 250 Å (Experiment 1) and an experiment in which a composition of an ohmic contact electrode was varied by varying a thickness of an Si film with a thickness of each of a Ti film and an Al film being fixed to 200 Å (Experiment 2) were conducted.

Figure 18:
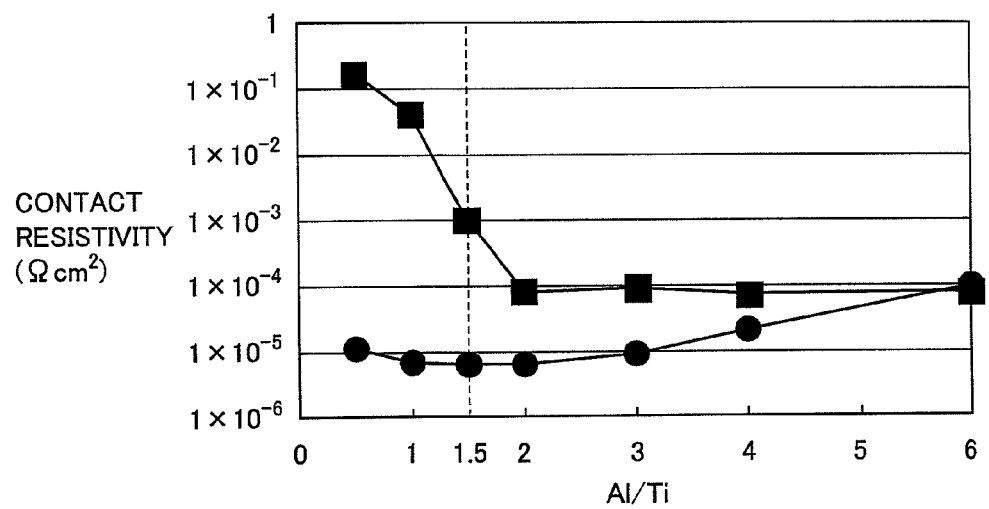
FIG. 18 is a diagram showing relation between a ratio of a film thickness of an Al film to a Ti film and contact resistivity.
Figure 19:
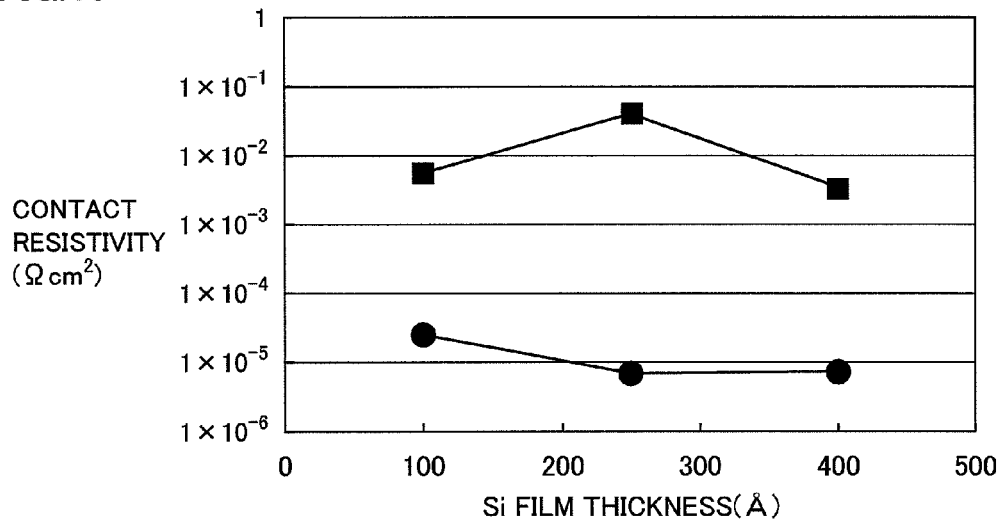
FIG. 19 is a diagram showing relation between a film thickness of an Si film and contact resistivity.

FIG. 18 shows results in Experiment 1, and FIG. 19 shows results in Experiment 2. In FIG. 18, the abscissa represents a ratio of a thickness of an Al film to a thickness of a Ti film and the ordinate represents contact resistivity. In addition, in FIG. 19, the abscissa represents a thickness of an Si film and the ordinate represents contact resistivity. In FIGS. 18 and 19, a circle represents contact resistance with the n-type SiC region and a square represents contact resistance with the p-type SiC region.

The results of the experiments will now be described. Referring to FIG. 18, it can be seen that too high a ratio of a thickness of the Al film to the Ti film leads to high contact resistance between the ohmic contact electrode and the n-type SiC region, while too low a ratio of thickness leads to high contact resistance between the ohmic contact electrode and the p-type SiC region. When the ratio of thickness above is lower than 1.5, contact resistance between the electrode and the p-type SiC region exceeds $1\times10^{-3}$ $\Omega\cdot$cm$^2$. When the ratio of thickness above exceeds 6, contact resistance between the electrode and the n-type SiC region exceeds $1\times10^{-4}$ $\Omega\cdot$cm$^2$.

For practical adoption as an ohmic contact electrode, preferably, contact resistance with the p-type SiC region is not higher than approximately $1\times10^{-3}$ $\Omega\cdot$cm$^2$ and contact resistance with the n-type SiC region is not higher than approximately $1\times10^{-4}$ $\Omega\cdot$cm$^2$. Therefore, it can be concluded from the results of the experiments above that an Al film at least 1.5 times and at most 6 times as thick as a Ti film is preferably formed in the step of forming an Al film above. It is noted that, based on the ratio of thickness above in the manufacturing process, the ohmic contact electrode preferably contains Al at least 1.58 times and at most 6.33 times as much as Ti in terms of an atomic ratio. In addition, it can be concluded from FIG. 18 that an Al film further preferably has a thickness at least two times as great as a Ti film in order to further reliably lower contact resistance with the p-type SiC region.

Meanwhile, referring to FIG. 19, it was found, from the results in Experiment 2 in which a thickness of the Si film was varied with a thickness of each of the Ti film and the Al film being fixed, that contact resistance of the ohmic contact electrode with any of the p-type SiC layer and the n-type SiC layer hardly varied even if a thickness of the Si film was varied, so long as a thickness of each of the Ti film and the Al film was constant. It became clear from the results above that contact resistance of the ohmic contact electrode can reliably be lowered, without much depending on a thickness of an Si film (a content of Si in the ohmic contact electrode), by setting a ratio of a thickness of the Al film to the Ti film (a ratio of an Al content to a Ti content in the ohmic contact electrode) to a range confirmed as preferable in Experiment 1 above.

EXAMPLE 3

Example 3 of the present invention will be described hereinafter. An experiment was conducted for checking a state of formation of an ohmic contact electrode included in the semiconductor device according to the present invention. A procedure in the experiment is as follows. It is noted that the "ohmic contact electrode" in the present application refers to an electrode formed to lower contact resistance with an SiC layer by forming a metal film on the SiC layer and subjecting the metal film to heat treatment.

Initially, a sample was fabricated by forming an ohmic contact electrode on an SiC layer in accordance with a procedure similar to the steps (S81) to (S84) in the first embodiment above. Thicknesses of the Ti film, the Al film and the Si film formed in the steps (S81) to (S83) were set to 50 Å, 500 Å and 250 Å, respectively (Example). For comparison, a sample having an ohmic contact electrode out of the scope of the present invention formed, by successively forming a Ti film having a thickness of 50 Å and an Al film having a thickness of 200 Å on an SiC layer followed by alloying heating treatment was also fabricated (Comparative Example).

Thereafter, the sample in Example above was cut in a cross-section perpendicular to a surface of the ohmic contact electrode and the cross-section was observed with an SEM (Scanning Electron Microscope) and photographed. In addition, while performing sputtering in a direction perpendicular to the surface of the ohmic contact electrode in each of the samples in Example and Comparative Example above, Augèr spectroscopic analysis was conducted to examine distribution of elements around the ohmic contact electrode.

Figure 20:
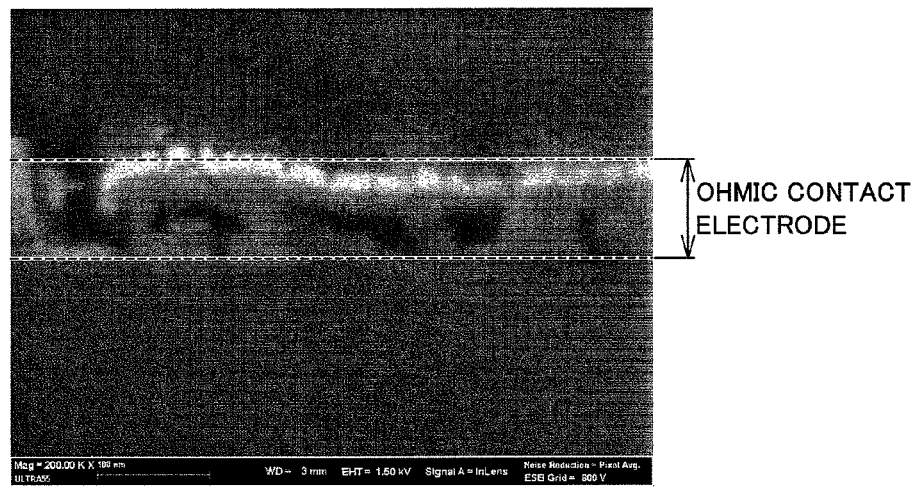
FIG. 20 is an SEM photograph of a portion around an ohmic contact electrode in an Example.

Results of the experiment will now be described with reference to FIGS. 20 to 22. In FIG. 20, the upper side shows a region outside the range of the sample and the lower side shows the semiconductor layer (the SiC layer). As shown in FIG. 20, a region different in brightness lying between these regions is the ohmic contact electrode. In addition, in FIGS. 21 and 22, the abscissa represents a sputtering time period and a depth from the surface of the ohmic contact electrode, and the ordinate represents corrected signal intensity.

Here, the corrected signal intensity refers to a value corresponding to atomic concentration of each element, obtained by correcting signal intensity of each element obtained in Augèr spectroscopic analysis with a correction factor. This corrected signal intensity can be calculated by calculating a value obtained by dividing signal intensify of each element obtained in Augèr spectroscopic analysis by sensitivity determined for each element and then making adjustment such that the sum of values for respective elements attains to 1. Though an element relative sensitivity factor (ERSF), an average matrix relative sensitivity factor (AMRSF) and the like may be used as sensitivity, an atomic relative sensitivity factor (ARSF) was adopted here. This sensitivity is affected by various factors such as a state of a sample, a measurement system or the like. Therefore, though obtained corrected signal intensity is not necessarily accurate in comparing an amount between elements or an absolute amount of an element, it can accurately represent increasing or decreasing tendency of each element or presence/absence thereof. In addition, a rate of sputtering above is set to approximately 2.5 nm/min in SiO$_2$ conversion.

Referring to FIG. 20, it is confirmed that the ohmic contact electrode having a substantially uniform thickness was formed on the SiC layer in the sample. Here, referring to this SEM photograph, the ohmic contact electrode extends from a position where an alloy layer composed of a metal and the like appears for the first time to the surface, when viewed from the SiC layer side toward the surface side (the ohmic contact electrode side).

Figure 21:
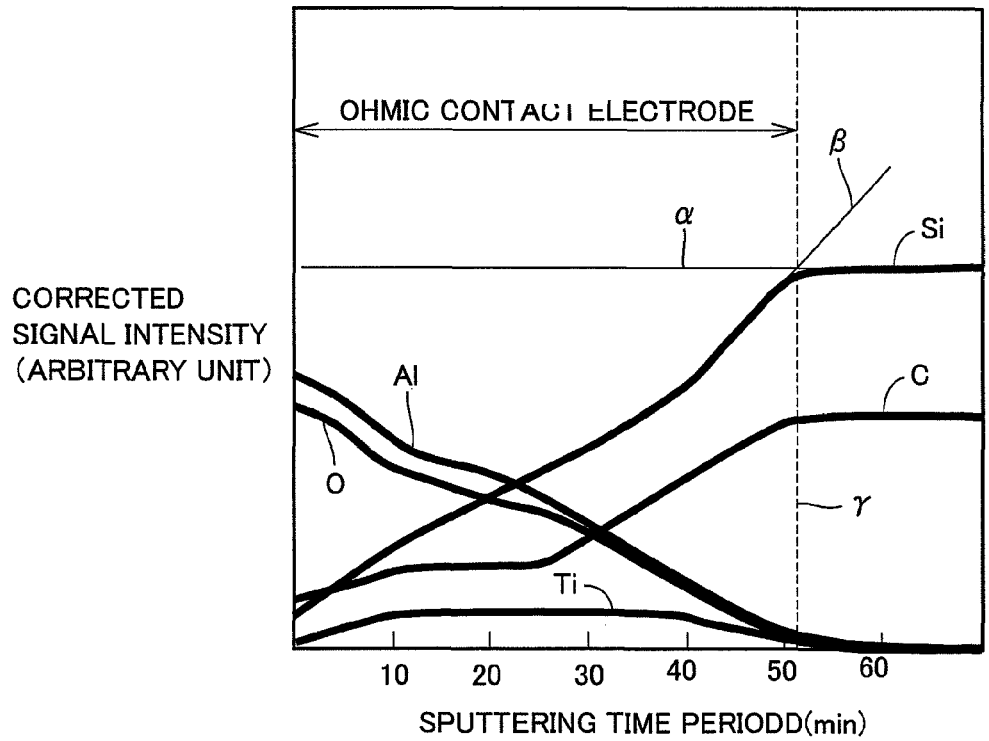
FIG. 21 is a diagram showing distribution of elements around the ohmic contact electrode in Example.
Figure 22:
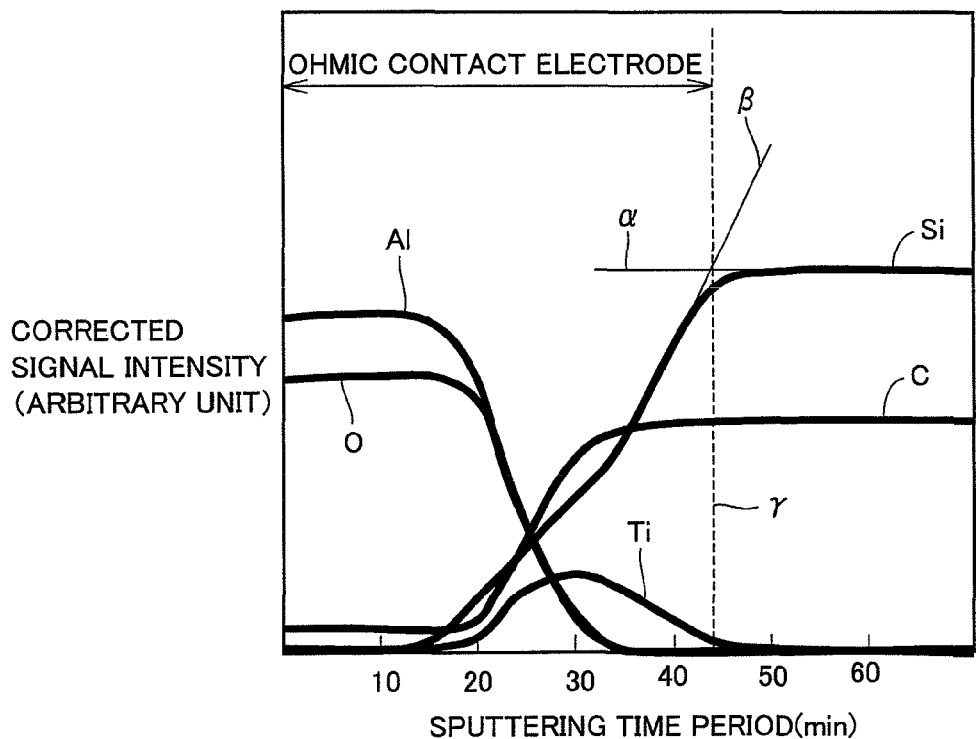
FIG. 22 is a diagram showing distribution of elements around the ohmic contact electrode in a Comparative Example.

In addition, referring to FIGS. 21 and 22, attention being paid to distribution of Si for example, a straight line α along distribution of Si in a region corresponding to SiC, that is, a region where concentration of Si is constant, and a straight line β along a region adjacent thereto on the electrode side (the surface side), in which concentration of Si lowers toward the surface, are drawn. Then, an area from the intersection of straight line α and straight line β toward the surface side is the ohmic contact electrode. Namely, a line segment γ indicates an interface between the SiC layer and the ohmic contact electrode. The ohmic contact electrodes in Example and Comparative Example above have features as follows. Namely, the electrode in Example contains Al and Ti in a region including the interface with the SiC layer. In contrast, though the electrode in Comparative Example contains Ti in a region including the interface with the SiC layer, it does not contain Al therein.

Moreover, a region of the electrode in Example including the surface opposite to the SiC layer contains Si. In contrast, a region of the electrode in Comparative Example including the surface opposite to the SiC layer does not contain Si. Further, in the electrode in Example, the content of Si monotonously increases toward the SiC layer. In contrast, in the electrode in Comparative Example, Si is not contained in a region having a prescribed thickness from the surface and it cannot be concluded that the content of Si monotonously increases toward the SiC layer.

In addition, in the electrode in Example, the content of Al monotonously decreases toward the SiC layer. In contrast, in the electrode in Comparative Example, the content of Al is constant in a region having a prescribed thickness from the surface and Al is not contained in a region having a prescribed thickness from the interface with the SiC layer. Therefore, it cannot be concluded that the content of Al monotonously decreases toward the SiC layer. Further, in the electrode in Example, the content of Ti monotonously increases from the surface opposite to the SiC layer toward the SiC layer and attains to the maximum value, and thereafter monotonously decreases. In contrast, in the electrode in Comparative Example, Ti is not contained in a region having a prescribed thickness from the surface, and it cannot be concluded that the content of Ti monotonously increases toward the SiC layer in this region.

Based on the differences above, it can be considered that the ohmic contact electrode in Example can be in contact with any of the p-type SiC region and the n-type SiC region with contact resistance being sufficiently suppressed, while the ohmic contact electrode in Comparative Example cannot achieve sufficiently suppressed contact resistance with the n-type SiC region.

In an actual semiconductor device, in many cases, an interconnection composed of Al or the like is formed on an ohmic contact electrode. In this case, if distribution of an element from the ohmic contact electrode toward the interconnection above is examined, a position where concentration of an element is discontinuous can be determined as an interface between the interconnection and the ohmic contact electrode (the surface opposite to the SiC wafer).

It should be understood that the embodiments and the examples disclosed herein are illustrative and non-restrictive in every respect. The scope of the present invention is defined by the terms of the claims, rather than the description above, and is intended to include any modifications within the scope and meaning equivalent to the terms of the claims.

INDUSTRIAL APPLICABILITY

A semiconductor device according to the present invention can particularly advantageously be applicable to a semiconductor device including an electrode arranged in contact with an SiC wafer.

DESCRIPTION OF THE REFERENCE SIGNS

1 MOSFET; 3 JFET; 10 SiC wafer; 11 $n^+$ SiC substrate; 11A one main surface; 11B the other main surface; 12 $n^-$ SiC layer; 12A first main surface; 12B second main surface; 13 p body; 13A channel region; 14 $n^+$ source region; 15 gate oxide film; 15A thermal oxide film; 16 source contact electrode; 17 gate electrode; 18 $p^+$ region; 19 source interconnection; 20 drain electrode; 21 passivation film; 22 source electrode; 30 SiC wafer; 31 n-type substrate; 32 first p-type layer; 33 n-type layer; 34 second p-type layer; 34A upper surface; 35 first n-type region; 36 first p-type region; 37 second n-type region; 38 oxide film; 39 source contact electrode; 41 gate contact electrode; 42 drain contact electrode; 43 second p-type region; 44 potential-holding contact electrode; 45 source interconnection; 46 gate interconnection; 47 drain interconnection; 51 Ti film; 52 Al film; 53 Si film; 61 source electrode; 62 gate electrode; 63 drain electrode; 64 passivation film; 71 groove portion; 71A bottom wall; 71B sidewall; 91 resist film; and 91A opening.

The invention claimed is:

1. A semiconductor device, comprising:
an SiC wafer composed of silicon carbide; and
an ohmic contact electrode arranged in contact with said SiC wafer and containing titanium, aluminum, silicon, and carbon as well as a remaining inevitable impurity,
said SiC wafer including
an n-type region having an n conductivity type, and
a p-type region having a p conductivity type,
each of said n-type region and said p-type region being in contact with said ohmic contact electrode, and
said ohmic contact electrode containing aluminum and titanium in a region including an interface with said SiC wafer.

2. The semiconductor device according to claim 1, wherein said ohmic contact electrode is arranged to extend from a region in contact with said n-type region to a region in contact with said p-type region.

3. The semiconductor device according to claim 1, comprising a plurality of said ohmic contact electrodes, wherein one said ohmic contact electrode of said plurality of ohmic contact electrodes is in contact with said n-type region and another said ohmic contact electrode is in contact with said p-type region.

4. A semiconductor device, comprising:
an SiC wafer composed of silicon carbide; and
an ohmic contact electrode arranged in contact with said SiC wafer and containing titanium, aluminum, silicon, and carbon as well as a remaining inevitable impurity,
said SiC wafer including
an n-type region having an n conductivity type, and
a p-type region having a p conductivity type,
each of said n-type region and said p-type region being in contact with said ohmic contact electrode, and
a region of said ohmic contact electrode including a surface opposite to said SiC wafer containing silicon.

5. The semiconductor device according to claim 4, wherein a content of silicon in said ohmic contact electrode monotonously increases toward said SiC wafer.

6. The semiconductor device according to claim 4, wherein a content of aluminum in said ohmic contact electrode monotonously decreases toward said SiC wafer.

7. The semiconductor device according to claim 4, wherein a content of titanium in said ohmic contact electrode monotonously increases from the surface opposite to said SiC wafer toward said SiC wafer and attains to a maximum value, and thereafter monotonously decreases.

8. The semiconductor device according to claim 4, wherein said ohmic contact electrode is arranged to extend from a region in contact with said n-type region to a region in contact with said p-type region.

9. The semiconductor device according to claim 4, comprising a plurality of said ohmic contact electrodes, wherein one said ohmic contact electrode of said plurality of ohmic contact electrodes is in contact with said n-type region and another said ohmic contact electrode is in contact with said p-type region.

10. A semiconductor device, comprising:
an SiC wafer composed of silicon carbide; and
an ohmic contact electrode arranged in contact with said SiC wafer and containing titanium, aluminum, silicon, and carbon as well as a remaining inevitable impurity, said SiC wafer including
an n-type region having an n conductivity type, and
a p-type region having a p conductivity type,
each of said n-type region and said p-type region being in contact with said ohmic contact electrode, and
in said ohmic contact electrode, a content of aluminum monotonously decreasing toward said SiC wafer and a content of silicon monotonously increasing toward said SiC wafer.

11. The semiconductor device according to claim 10, wherein
a content of titanium in said ohmic contact electrode monotonously increases from a surface opposite to said SiC wafer toward said SiC wafer and attains to a maximum value, and thereafter monotonously decreases.

12. The semiconductor device according to claim 10, wherein
said ohmic contact electrode is arranged to extend from a region in contact with said n-type region to a region in contact with said p-type region.

13. The semiconductor device according to claim 10, comprising a plurality of said ohmic contact electrodes, wherein one said ohmic contact electrode of said plurality of ohmic contact electrodes is in contact with said n-type region and another said ohmic contact electrode is in contact with said p-type region.

* * * * *